(12) United States Patent
Asano et al.

(10) Patent No.: US 10,987,649 B2
(45) Date of Patent: Apr. 27, 2021

(54) MICROREACTOR SYSTEM

(71) Applicant: Hitachi Plant Services Co., Ltd., Tokyo (JP)

(72) Inventors: Yukako Asano, Tokyo (JP); Masashi Oda, Tokyo (JP)

(73) Assignee: HITACHI PLANT SERVICES CO., LTD., Tokyo (JP)

(*) Notice: Subject to any disclaimer, the term of this patent is extended or adjusted under 35 U.S.C. 154(b) by 0 days.

(21) Appl. No.: 16/644,485

(22) PCT Filed: Jul. 27, 2018

(86) PCT No.: PCT/JP2018/028222
§ 371 (c)(1),
(2) Date: Mar. 4, 2020

(87) PCT Pub. No.: WO2019/049547
PCT Pub. Date: Mar. 14, 2019

(65) Prior Publication Data
US 2020/0282376 A1 Sep. 10, 2020

(30) Foreign Application Priority Data
Sep. 6, 2017 (JP) .............................. JP2017-171606

(51) Int. Cl.
*B01J 19/00* (2006.01)

(52) U.S. Cl.
CPC .. *B01J 19/0093* (2013.01); *B01J 2219/00051* (2013.01); *B01J 2219/00184* (2013.01);
(Continued)

(58) Field of Classification Search
CPC ............ B01J 19/0093; B01J 2219/0051; B01J 2219/00184; B01J 2219/00164;
(Continued)

(56) References Cited

U.S. PATENT DOCUMENTS

| 2004/0079424 A1 | 4/2004 | Takeda et al. |
| 2005/0087562 A1 | 4/2005 | Koide et al. |

(Continued)

FOREIGN PATENT DOCUMENTS

| CN | 106893015 A | 6/2017 |
| JP | 2004-170295 A | 6/2004 |

(Continued)

OTHER PUBLICATIONS

Machine Translation of JP 4380492 (Year: 2009).*
(Continued)

*Primary Examiner* — Lessanework Seifu
(74) *Attorney, Agent, or Firm* — Procopio, Cory, Hargreaves & Savitch LLP

(57) ABSTRACT

A microreactor system that can mix fluids at precise timing has two inlets into which fluids are introduced and merges, in a channel, a first fluid introduced from a first inlet and a second fluid introduced from a second inlet, a first pump that sends the first fluid toward the inlets, and a second pump that sends the second fluid toward the inlets, a first fluid detector that detects an arrival of the first fluid at the first inlet, and a second fluid detector that detects an arrival of the second fluid at the second inlet.

8 Claims, 14 Drawing Sheets

(52) U.S. Cl.
CPC ............... *B01J 2219/00337* (2013.01); *B01J 2219/00353* (2013.01); *B01J 2219/00452* (2013.01); *B01J 2219/00867* (2013.01); *B01J 2219/00889* (2013.01); *B01J 2219/00959* (2013.01); *B01J 2219/00961* (2013.01); *B01J 2219/00988* (2013.01)

(58) Field of Classification Search
CPC .... B01J 2219/00337; B01J 2219/00353; B01J 2219/00452; B01J 2219/00867; B01J 2219/00889; B01J 2219/00959; B01J 2219/00961; B01J 2219/00988
See application file for complete search history.

(56) References Cited

U.S. PATENT DOCUMENTS

| | | |
|---|---|---|
| 2012/0040472 A1 | 2/2012 | Churski et al. |
| 2016/0288081 A1 | 10/2016 | Moonen et al. |

FOREIGN PATENT DOCUMENTS

| | | |
|---|---|---|
| JP | 2006-247534 A | 9/2006 |
| JP | 2007-113433 | 5/2007 |
| JP | 4380492 B2 | 12/2009 |
| JP | 2011-212549 A | 10/2011 |
| JP | 5376236 B2 | 12/2013 |
| JP | 2015-202461 A | 11/2015 |
| JP | 2016-047528 A | 4/2016 |
| WO | 2006/043642 A1 | 4/2006 |
| WO | 2017/179353 A1 | 10/2017 |

OTHER PUBLICATIONS

International Search Report and Written Opinion for related PCT App No. PCT/JP2018/028222 dated Sep. 11 2018, English translation of ISR provided, 10 pgs.

Extended European Search Report for related European Patent Application No. 18853260.0 dated Jan. 26, 2021 (11 pages).

* cited by examiner

MICROREACTOR SYSTEM

CROSS-REFERENCE TO RELATED APPLICATIONS

This application is a U.S. National Stage entry of PCT Application No: PCT/JP2018/028222 filed Jul. 27, 2018, which claims priority to Japanese Patent Application No. 2017-171606, filed on Sep. 6, 2017, the contents of which are incorporated herein by reference.

TECHNICAL FIELD

The present invention relates to a microreactor system including a microreactor that mixes a fluid.

BACKGROUND ART

In recent years, the use of microreactors has been promoted in the fields of biotechnology and manufacture of pharmaceuticals, chemical products, and the like. The microreactor is a flow-type reactor having a micrometer-order microchannel, and is used for mixing and reacting fluids. The microreactor is generally manufactured by utilizing a microfabrication technique such as molding and lithography, and a replaceable, detachable type and a single-use type intended for disposal have also been considered.

The microreactor uses a microchannel as a reaction field, and can rapidly mix fluids by molecular diffusion. Further, as compared with a conventional batch method using a large-sized reactor, an effect of a surface area on a volume of a fluid is increased. Thus, efficiency of heat transfer, heat conduction, chemical reaction, and the like is increased. Due to these characteristics, an application of the microreactor is expected to reduce reaction time and improve a reaction yield in various fields.

Further, the microreactor provides a small reaction field in a closed system, and thus is suitable for handling corrosive substances, reactive substances, other dangerous substances, and reactions involving danger. In addition, flexibility in numbering up is high due to a small occupied volume, and a mass production of substances can be achieved with simplified consideration of chemical engineering. Therefore, the application of microreactors in a wide range of fields is expected to accelerate further.

In general, the microreactor is systemized together with a pump, a pipe, a temperature controller, and the like, and various operations are semi-automated for use. In the field of manufacturing of pharmaceuticals and the like, it is required to comply with the good manufacturing practice (GMP: standards for manufacturing control and quality control of pharmaceuticals). Thus, the microreactor system is also required to comply with the regulation.

Specifically, in addition to a design, assembly, maintenance, and the like of the microreactor itself, sterility and non-elution properties for the entire liquid contact part such as piping are required to be assured, and a performance is required such that no deterioration or contamination of raw materials, intermediates, or the like occurs. Further, reproducibility of the processing is required, and it is necessary to cope with validation of control software and troubleshooting such as leak countermeasures.

Conventionally, a fluid transfer (liquid feeding) in the microreactor systems has been considered.

For example, PTL 1 describes a microfluidic device including a microfluidic chip as an example of a microreactor system. In the microfluidic device, after a temperature adjustment of the microfluidic chip is completed, the processing proceeds to a liquid cueing process, and solution feeding is performed under a predetermined condition (see paragraph [0063]).

Further, PTL 2 describes a liquid reactor having a microreaction space as an example of a microreactor system. In the liquid reactor, after a temperature of a substrate is adjusted and a channel is washed, a pump is operated to feed a raw material solution by pressure into a processing channel (see paragraph [0263] and the like). PTL 2 describes that two systems of a mixed substrate and a reaction substrate are used (see paragraph [0279] and the like), a mixing promoting substance is used (see paragraph [0346] and the like), and a backwash pump is used (see paragraph [0416] and the like) when reaction products are easily precipitated in the microreaction space.

CITATION LIST

Patent Literature

PTL 1: JP 4380492 B2
PTL 2: WO 2006/043642 A

SUMMARY OF INVENTION

Technical Problem

Conventionally, fluids prepared in tanks or the like have been introduced into a general microreactor by an operation of a pump. The prepared individual fluids start to flow when the pump starts a transfer, are introduced into the microreactor through different inlets, flow through a microchannel, and merge to start mixing or reacting. The mixing ratio of the fluids is adjusted, in general, by individually adjusting the flow rates of the individual fluids.

Unfortunately, it is difficult to mix fluids at precise timing in a technique of introducing the fluids prepared in the tanks or the like into the microreactor in accordance with the operation of the pump. Depending on a composition and a viscosity of the fluids, a distance from the tanks in which the fluids are prepared, and the like, when the transfer of the fluids is started by the operation of the pump, the fluids reach a junction at which the fluids merge, at deviated timing. As a result, immediately after the fluids are introduced into the microreactor, the fluids are not mixed at a desired mixing ratio, and unintended solid may be formed to block the microchannel, for example, when a solid is precipitated by the fluid mixing or when a reaction product includes a solid.

Further, when a large flow rate difference occurs between the fluids, such as when the mixing ratio is biased toward one of the fluids, more precise timing of the fluid mixing is required. For example, when the fluids prepared in the tanks or the like are introduced into the microreactor in accordance with the operation of the pump in order to merge the fluids in the microchannel, a high flow rate fluid may flow back to a low flow rate channel from the junction when the fluids reach the junction at inappropriate timing.

In particular, tubes, capillaries, and the like as piping connected to the microreactor often have a product difference in an inner diameter or the like even when they have the same specification. When the fluids prepared in the tanks or the like are introduced into the microreactor in accordance with the operation of the pump in order to merge the fluids in the microchannel, a flow velocity difference is likely to occur during the transfer. Therefore, the fluids are likely to reach the junction at deviated timing.

As described in PTL 1 regarding the problem of the timing of merging fluids, an act of feeding a solution until all liquid detection sensors are turned on may generate a solid in the microchannel at a completion of a cueing process, for example, when a solid is precipitated by the fluid mixing, or when the reaction product includes a solid. Further, as described in PTL 2, using two systems of substrates, using a mixing promoting object, or using a backwash pump complicates the apparatus, increases costs, and does not solve a problem caused by a product difference of piping.

It is, therefore, an object of the present invention to provide a microreactor system capable of mixing fluids at precise timing.

In order to solve the above problem, a microreactor system includes a microreactor that has two inlets into which fluids are introduced and a channel merging the fluids, and mixes, in the channel, a first fluid introduced from a first inlet of the inlets and a second fluid introduced from a second inlet of the inlets, a first pump that sends the first fluid toward the inlets, a second pump that sends the second fluid toward the inlets, a first fluid detector that detects an arrival of the first fluid at the first inlet, and a second fluid detector that detects an arrival of the second fluid at the second inlet, in which the first pump, after starting a transfer of the first fluid toward the first inlet, stops the transfer by detection by the first fluid detector, the second pump, after starting a transfer of the second fluid toward the second inlet, stops the transfer by detection by the second fluid detector, each of the first pump and the second pump resumes the transfer after the transfer of the first fluid is stopped and after the transfer of the second fluid is stopped, and the first fluid of which transfer has been temporarily stopped and the second fluid of which transfer has been temporarily stopped are introduced into the microreactor and mixed.

Advantageous Effects of Invention

A microreactor system according to the present invention can mix fluids at precise timing.

DESCRIPTION OF EMBODIMENTS

First Embodiment

First, a microreactor system according to a first embodiment of the present invention will be described with reference to the drawings. In the following drawings, the same components are denoted by the same reference signs, and redundant description will be omitted.

Figure 1:
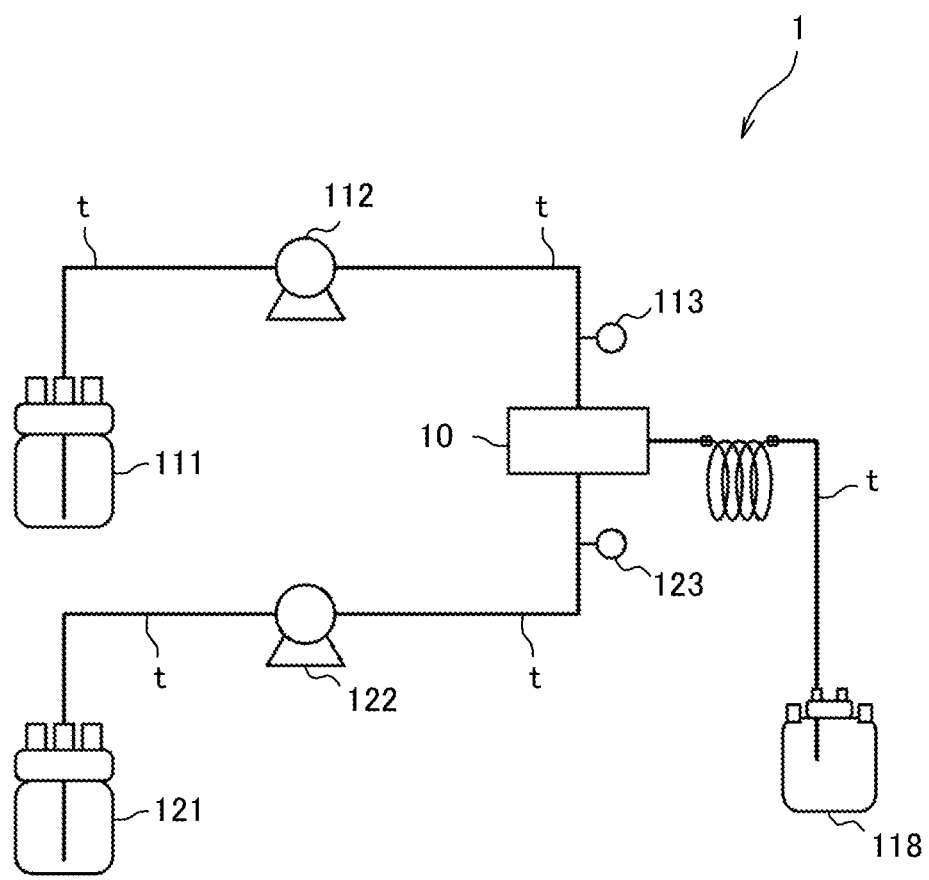
FIG. 1 is a schematic diagram of a microreactor system according to a first embodiment.

FIG. 1 is a schematic diagram of a microreactor system according to the first embodiment.

As shown in FIG. 1, the microreactor system 1 according to the first embodiment includes a microreactor 10, a first fluid container 111, a first fluid pump (first pump) 112, a first fluid detection sensor (first fluid detector) 113, a second fluid container 121, a second fluid pump (second pump) 122, a second fluid detection sensor (second fluid detector) 123, a recovery container 118, and a tube t.

The microreactor system 1 shown in FIG. 1 mixes fluids introduced into the microreactor 10 to generate a mixture of the fluids or a reaction product (mixed fluid) by a reaction of the fluids. The microreactor 10 is a flow-type reactor, and has two inlets into which the individual fluids are introduced, a microchannel that merges and mixes the fluids, and an outlet that allows the mixed fluid after the merging to flow out.

In the microreactor system 1, as described later, arrivals of the fluids at the inlets of the microreactor 10 are detected by fluid detection sensors. Then, after all pipelines to the inlets are filled with the fluids, mixing by an introduction of the fluids into the microreactor 10 is started. Hereinafter, a case where a liquid first fluid and a liquid second fluid are used as the fluids will be described as an example.

As shown in FIG. 1, the first fluid container 111 that stores the prepared first fluid, and the first fluid pump 112 that sends the first fluid toward a first inlet of the microreactor 10 are connected to the first inlet of the microreactor 10 via the tube t. The first fluid container 111 is connected to the first fluid pump 112, and the first fluid pump 112 is connected to the first inlet of the microreactor 10.

The second fluid container 121 that stores the prepared second fluid, and the second fluid pump 122 that sends the second fluid toward a second inlet of the microreactor 10 are connected to the second inlet of the microreactor 10 via the tube t. The second fluid container 121 is connected to the second fluid pump 122, and the second fluid pump 122 is connected to the second inlet of the microreactor 10.

The recovery container 118 is connected to the outlet of the microreactor 10 via the tube t. The tube t is made of, for example, polytetrafluoroethylene (PTFE). The tube t is connected to the microreactor 10, a pump, a container, and the like via a fitting (not shown) or the like.

As the first fluid pump 112 and the second fluid pump 122, an appropriate pump such as a tube pump, a plunger pump, a diaphragm pump, or a screw pump is used. Examples of materials for a liquid contact part such as a tube, a syringe, and a diaphragm provided in the pump include resin materials such as polydimethylsiloxane (PDMS), silicone resin, polypropylene (PP), and fluororesin such as PTFE.

Hereinafter, a specific example of the microreactor 10 usable in the microreactor system 1 will be described.

Figure 2:
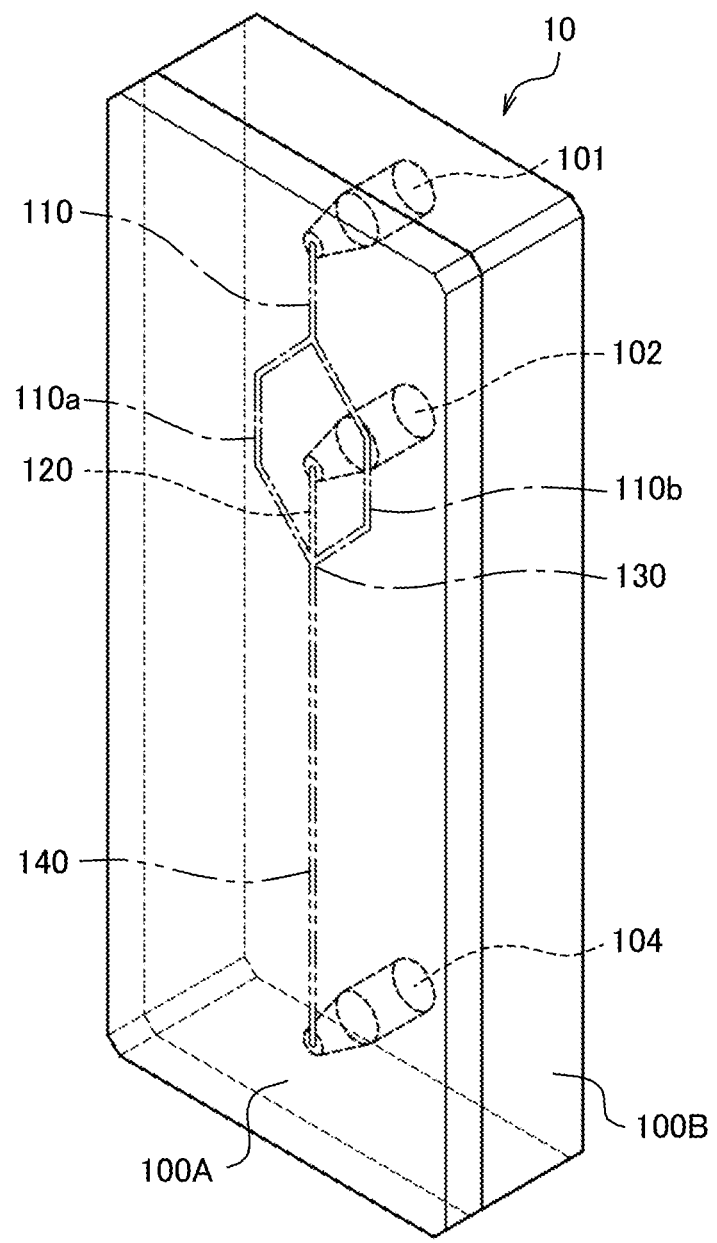
FIG. 2 is a diagram showing an example of a microreactor.

FIG. 2 is a diagram showing an example of the microreactor.

As shown in FIG. 2, a microreactor 10 having a channel volume that is asymmetric between the fluids can be used. The microreactor 10 has two inlets (101, 102) into which the fluids are respectively introduced, microchannels (110, 120, 140) that merge and mix the individually introduced fluids, and an outlet 104 that allows a mixed fluid after the merging at a junction 130 to flow out.

The microreactor 10 is formed by overlapping an upper plate 100A and a lower plate 100B. The upper plate 100A is grooved. The lower plate 100B overlaps the upper plate 100A so as to cover the groove, and the microchannels (110, 120, 140) are formed on the same plane. In the lower plate 100B, a through hole is provided at a position overlapping each end of the microchannels (110, 120, 140), and a high flow rate inlet 101, a low flow rate inlet 102, and the outlet 104 are open to an opposite face.

Each through hole of the lower plate 100B has a diameter larger than diameters of the microchannels (110, 120, 140). A thread groove (not shown) is formed in each through hole, and the tube t is connected via a fitting that can be screwed into the thread groove. However, the diameter of each through hole may not be larger than the diameters of the microchannels (110, 120, 140). For example, the tube t may be directly connected to the through hole without forming the thread groove in the through hole.

The microchannels (110, 120, 140) are configured by a high flow rate channel 110 extending from the high flow rate inlet 101 to the junction 130, a low flow rate channel 120 extending from the low flow rate inlet 102 to the junction 130, and a discharge channel 140 extending from the junction 130 to the outlet 104.

The high flow rate channel 110, the low flow rate channel 120, and the discharge channel 140 each preferably have a channel width and a channel depth of 2 mm or less. In particular, the channel width and the channel depth of immediately before the junction 130 and of the discharge channel 140 are preferably in a range of several tens μm or more and 1 mm or less in terms of rapid mixing.

The high flow rate channel 110 is used to allow a fluid to flow, the fluid having a high mixing ratio and a relatively high flow rate among the fluids to be mixed. On the other hand, the low flow rate channel 120 is used to allow a fluid to flow, the fluid having a low mixing ratio and a relatively low flow rate.

As shown in FIG. 2, the high flow rate channel 110 has a total channel volume larger than a total channel volume of the low flow rate channel 120. For example, a channel length of the high flow rate channel 110 is longer than a channel length of the low flow rate channel 120 having the equal channel width and channel depth. This structure reduces a deviation of timing at which the fluids reach the junction 130 when the mixing ratio is biased toward one of the fluids and a large flow rate difference occurs between the fluids.

Further, as shown in FIG. 2, the high flow rate channel 110 branches into two symmetrical branch channels 110a and 110b at an intermediate part, and merges with each other at a junction 130. The low flow rate channel 120 is connected to the junction 130 from between the two branch channels 110a and 110b, and a low flow rate fluid and a high flow rate fluid flowing from the same side flows to the discharge channel 140 on the opposite side. In this structure, the low flow rate fluid starts mixing between the high flow rate fluids, and thus an area of an interface between the fluids increases, and mixing efficiency improves.

The microreactor 10 is formed of an appropriate material that is chemically stable, has low reactivity with a fluid and low elution, and has necessary workability and mechanical properties. Examples of the material of the microreactor 10 include stainless steel, silicon, gold, glass, Hastelloy, ceramic, silicone resin, cycloolefin polymer, cycloolefin copolymer, polyethylene (PE), polypropylene (PP), polymethylpentene (PMP), polydimethylsiloxane (PDMS), acrylonitrile-butadiene-styrene (ABS) resin, polycarbonate (PC), acrylic resin, and various fluorine-based resins. The material may also be subjected to a glass lining, a coating of nickel, gold or the like, or an oxidation treatment of silicon or the like.

As shown in FIG. 1, in the microreactor system 1, the first fluid detection sensor 113 is disposed near the first inlet of the microreactor 10 between the first fluid pump 112 and the microreactor 10. The first fluid detection sensor 113 detects that the first fluid to be introduced from the first inlet of the microreactor 10 reaches the first inlet of the microreactor 10.

Further, the second fluid detection sensor 123 is disposed near the second inlet of the microreactor 10 between the second fluid pump 122 and the microreactor 10. The second fluid detection sensor 123 detects that the second fluid to be introduced from the second inlet of the microreactor 10 reaches the second inlet of the microreactor 10.

As the first fluid detection sensor 113 and the second fluid detection sensor 123, an appropriate detector is used in accordance with the type of fluid. For example, a detector that detects changes in an image, light absorption, refraction, reflection, scattering, electrical continuity, resistance, capacitance, pressure, temperature, ultrasonic waves, magnetism, or the like can be used. The detector may be a device that detects a specific component by ultraviolet spectroscopy, infrared spectroscopy, Raman spectroscopy, or the like, or detects by turbidity or the like.

The first fluid detection sensor 113 and the second fluid detection sensor 123 can transmit a detection signal to a control device (not shown). The control device has a function of controlling a stop of the operations of the first fluid pump 112 and the second fluid pump 122 by inputting the detection signals from the first fluid detection sensor 113 and the second fluid detection sensor 123.

Note that the microreactor 10 may be of a single-use (disposable) type in which the microreactor 10 is discarded after a single use. The above-described resin materials are preferably used as the material of the single-use type microreactor 10. In addition to the microreactor 10, the first fluid container 111, the second fluid container 121, the recovery container 118, the tube t, the fitting, and the like, and other liquid contact parts may be of a single-use (disposable) type.

Next, a specific operation method of the microreactor system 1 will be described.

In the microreactor system 1, the arrivals of the fluids at the inlets of the microreactor 10 are detected by the first fluid detection sensor 113 and the second fluid detection sensor 123. Then, after the pipeline to the first inlet and the pipeline to the second inlet are both filled with the fluids, mixing by the introduction of the fluids into the microreactor 10 is started.

The arrivals of the fluids near the inlets (101, 102) are detected, transfers (liquid feeding) of the fluids are temporarily stopped, and the pipelines to the inlets are thereby filled with the fluids. The channel volume of the microchannels (110, 120, 140) ahead of the inlets (101, 102) of the microreactor 10 is minuscule. Therefore, while the pipes to the inlets are filled with the fluids, and leading end positions of the fluids are controlled until immediately before mixing, the timing of the arrivals of the fluids at the junction 130 can be substantially controlled.

Further, the mixing of the fluid by the microreactor 10 is started when both of the two types of fluids are introduced into the microreactor 10. Therefore, when the transfer (liquid feeding) of at least one of the first fluid and the second fluid is temporarily stopped, the transfer (liquid feeding) of the fluid of which transfer (liquid feeding) is stopped is resumed at appropriate timing to synchronize the timing at which the fluids reach the junction 130.

Figure 3:
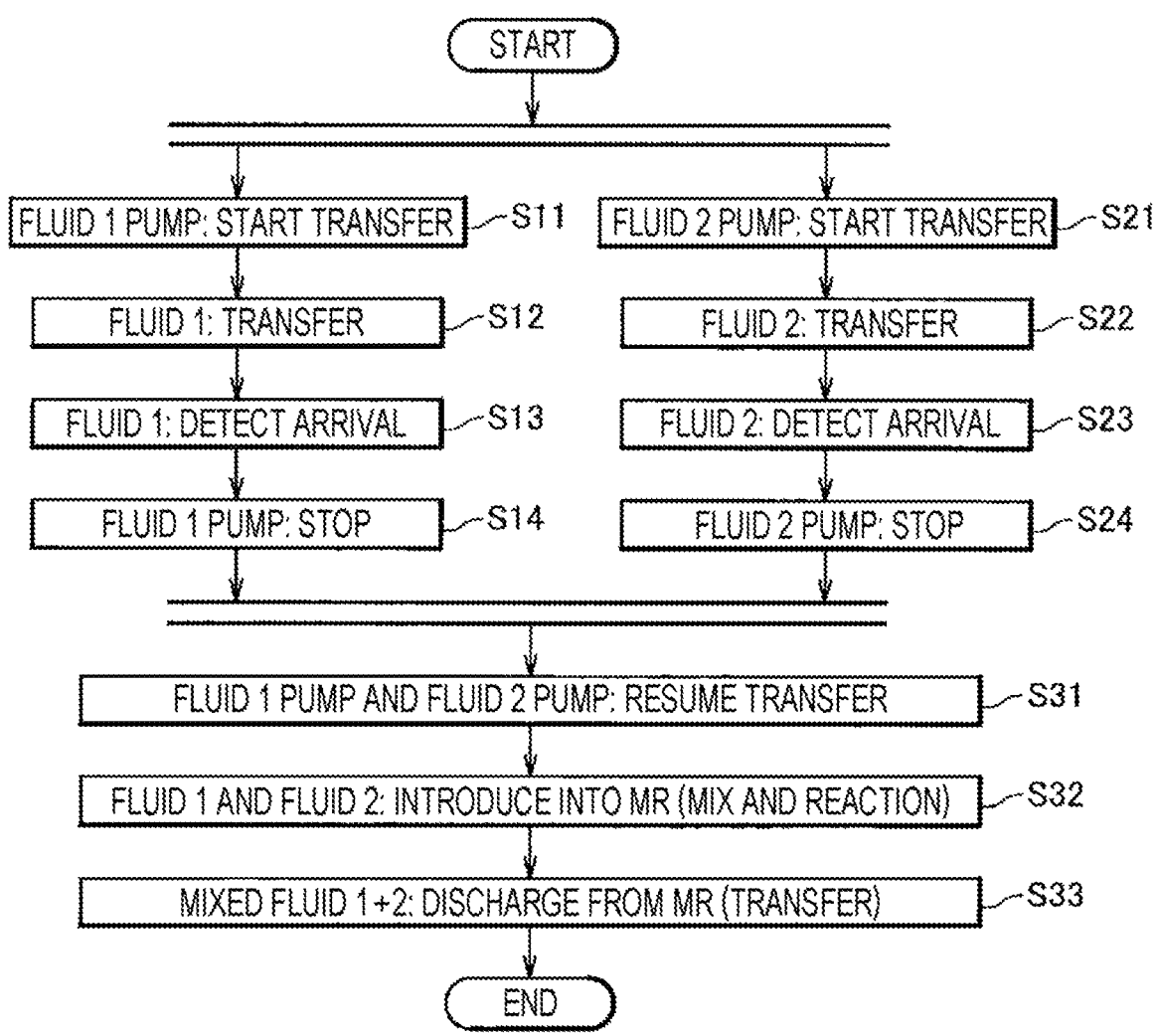
FIG. 3 is a flowchart showing an example of an operation method of the microreactor system according to the first embodiment.

FIG. 3 is a flowchart showing an example of the operation method of the microreactor system according to the first embodiment.

FIG. 3 shows the operation method in which the transfers (liquid feeding) of both the first fluid and the second fluid are temporarily stopped in the microreactor system 1.

First, in this operation method, the first fluid pump 112 starts the transfer of the fluid (step S11) for mixing fluids. The first fluid pump 112 starts operating, and then the transfer of the first fluid toward the first inlet of the microreactor 10 is started. The first fluid is transferred through the tube t from the first fluid container 111 toward the first inlet of the microreactor 10 (step S12) by the operation of the first fluid pump 112.

After the transfer of the first fluid toward the first inlet of the microreactor 10 is started, when the leading end position of the first fluid reaches the first inlet of the microreactor 10, the arrival of the first fluid is detected by the first fluid detection sensor 113 (step S13). The detection signal from the first fluid detection sensor 113 is transmitted to the control device.

Subsequently, the control device stops the first fluid pump 112 and stops the transfer of the first fluid (step S14) based on the detection by the first fluid detection sensor 113. When the transfer of the first fluid is stopped, the pipeline to the first inlet of the microreactor 10 is filled with the first fluid of which transfer is stopped.

Further, for mixing the fluids, similarly to the first fluid, the second fluid is also transferred (fed) toward the second inlet of the microreactor 10. When the leading end position of the second fluid reaches the second inlet of the microreactor 10, the transfer (liquid feeding) of the second fluid is temporarily stopped.

Specifically, the transfer of the fluid by the second fluid pump 122 is started (step S21), and the second fluid is transferred toward the second inlet of the microreactor 10 (step S22). Then, after the transfer of the second fluid toward the second inlet of the microreactor 10 is started, the arrival of the second fluid is detected by the second fluid detection sensor 123 (step S23), the second fluid pump 122 is stopped based on the detection, and the transfer of the second fluid is stopped (step S24). When the transfer of the second fluid is stopped, the pipeline to the second inlet of the microreactor 10 is filled with the second fluid of which transfer is stopped.

Note that there is no particular limitation to an order of the operation of transferring the first fluid and temporarily stopping the transfer of the first fluid, and the operation of transferring the second fluid and temporarily stopping the transfer of the second fluid. The operation of the first fluid may precede, the operation of the second fluid may precede, or the operations may be performed simultaneously.

Subsequently, after the detection by the first fluid detection sensor 113 and after the detection by the second fluid detection sensor 123, each of the first fluid pump 112 and the second fluid pump 122 resumes the transfer (step S31) based on a signal input from the control device. That is, after the first fluid pump 112 is temporarily stopped based on the detection and the transfer of the first fluid is stopped, and after the second fluid pump 122 is temporarily stopped and the transfer of the second fluid is stopped, the fluid transfer is resumed at an arbitrary time.

When the transfers are resumed, the stopped first fluid of which transfer has been temporarily stopped and the stopped second fluid of which transfer has been temporarily stopped at the inlets of the microreactor 10 are introduced into the microreactor 10 (step S32). Then, the first fluid is introduced from the first inlet of the microreactor 10, for example, from the high flow rate inlet 101, flows through the high flow rate channel 110, and reaches the junction 130. Further, the second fluid is introduced from the second inlet of the microreactor 10, for example, from the low flow rate inlet 102, flows through the low flow rate channel 120, and reaches the junction 130. Then, the first fluid and the second fluid merge at the junction 130 and start mixing or reacting.

Next, the mixed fluid after the merging at the junction 130 flows through the discharge channel 140 and is discharged from the outlet 104 (step S33). Subsequently, the mixed fluid flows through the tube t while continuing mixing or reacting, and is finally recovered in the recovery container 118.

As described above, in the operation method in which the transfers of both the first fluid and the second fluid are temporarily stopped, the pipelines to the inlets of the microreactor 10 can be filled with the fluids immediately before the fluids are mixed. Thus, the leading end positions of the fluids can be easily controlled until immediately before mixing. As a result, the timing at which the fluids reach the junction 130 can be substantially controlled, and the timing can be synchronized by the control. Therefore, in the microreactor system 1, the fluids can be mixed at precise timing.

In this operation method, even when a large flow rate difference occurs between the fluids, such as when the mixing ratio is biased toward one of the fluids, the timing at which the fluids reach the junction 130 can be controlled. Thus, the high flow rate fluid can be prevented from flowing back from the junction 130 to the low flow rate channel. Further, the leading end positions of the fluids are arranged at the inlets of the microreactor 10, and thus an influence of a product difference such as an inner diameter of a pipe (tube t) is reduced. An unintended flow velocity difference is also prevented during the transfer of the fluids. In addition, the fluids can be mixed at precise timing. As a result, the processing time of the operation of mixing the fluids can be reduced, and the fluids can be used without waste.

Figure 4:
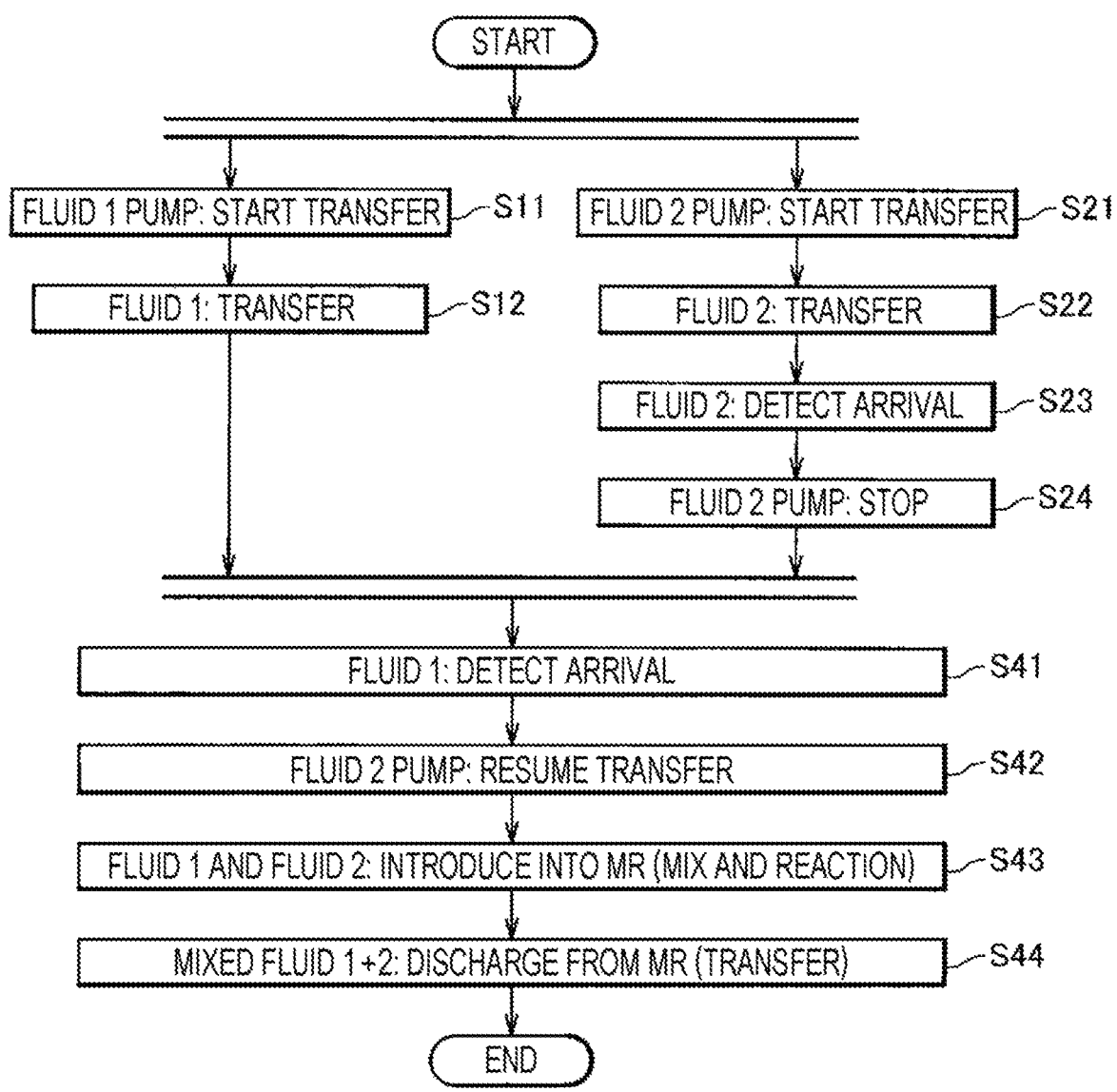
FIG. 4 is a flowchart showing another example of the operation method of the microreactor system according to the first embodiment.

FIG. 4 is a flowchart showing another example of the operation method of the microreactor system according to the first embodiment.

FIG. 4 shows the operation method in the microreactor system 1 in which the transfer (liquid feeding) of only the second fluid of the first fluid and the second fluid is temporarily stopped.

In this operation method, for mixing fluids, the transfer of the fluid by the first fluid pump 112 is started at an arbitrary time (step S11). The first fluid pump 112 starts operating, and then the transfer of the first fluid toward the first inlet of the microreactor 10 is started. The first fluid is transferred through the tube t from the first fluid container 111 toward the first inlet of the microreactor 10 (step S12) by the operation of the first fluid pump 112.

For mixing the fluids, the second fluid is transferred (fed) toward the second inlet of the microreactor 10. When the leading end position of the second fluid reaches the second inlet of the microreactor 10, the transfer (liquid feeding) of the second fluid is temporarily stopped.

Specifically, the transfer of the fluid by the second fluid pump 122 is started (step S21), and the second fluid is transferred toward the second inlet of the microreactor 10 (step S22). Then, after the transfer of the second fluid toward the second inlet of the microreactor 10 is started, the arrival of the second fluid is detected by the second fluid detection sensor 123 (step S23), the second fluid pump 122 is stopped based on the detection, and the transfer of the second fluid is stopped (step S24). When the transfer of the second fluid is stopped, the pipeline to the second inlet of the microreactor 10 is filled with the second fluid of which transfer is stopped.

The operation of transferring the second fluid and temporarily stopping the transfer of the second fluid may be performed before the transfer of the first fluid is started, or may be performed after the transfer of the first fluid is started and before the first fluid reaches the first inlet of the microreactor 10.

Meanwhile, the first fluid pump 112 continues to operate, and transfers the first fluid toward the first inlet of the microreactor 10. When the leading end position of the first fluid reaches the first inlet of the microreactor 10, the arrival of the first fluid is detected by the first fluid detection sensor 113 (step S41). The detection signal from the first fluid detection sensor 113 is transmitted to the control device.

Subsequently, after the detection by the second fluid detection sensor 123 and after the detection by the first fluid detection sensor 113, the second fluid pump 122 resumes the transfer based on the signal input from the control device (step S42). That is, after the second fluid pump 122 is temporarily stopped by the detection and the transfer of the second fluid is stopped, and after the detection by the first fluid detection sensor 113, the transfer of the fluid is immediately resumed.

When the transfer is resumed, the first fluid being transferred and the second fluid of which transfer has been temporarily stopped at the second inlet of the microreactor 10 are introduced into the microreactor 10 (step S43). Then, the first fluid and the second fluid merge at the junction 130 and start mixing or reacting.

Next, the mixed fluid after the merging at the junction 130 flows through the discharge channel 140 and is discharged from the outlet 104 (step S44). Subsequently, the mixed fluid flows through the tube t while continuing mixing or reacting, and is finally recovered in the recovery container 118.

As described above, in the operation method in which the transfer of only one fluid of the first fluid and the second fluid is temporarily stopped, the pipelines to the inlets of the microreactor 10 can be filled with the fluids immediately before the fluids are mixed, while the other fluid is kept flowing. Thus, the leading end positions of the fluids can be easily controlled until immediately before mixing. As a result, the timing at which the fluids reach the junction 130 can be substantially controlled, and the timing can be synchronized by the control. Therefore, in the microreactor system 1, the fluids can be mixed at precise timing.

In this operation method, even when a large flow rate difference occurs between the fluids, such as when the mixing ratio is biased toward one of the fluids, the timing at which the fluids reach the junction 130 can be controlled. Thus, the high flow rate fluid can be prevented from flowing back from the junction 130 to the low flow rate channel. Further, the leading end positions of the fluids are arranged at the inlets of the microreactor 10, and thus an influence of a product difference such as an inner diameter of a pipe (tube t) is reduced. An unintended flow velocity difference is also prevented during the transfer of the fluids. In addition, the fluids can be mixed at precise timing. As a result, the processing time of the operation of mixing the fluids can be reduced, and the fluids can be used without waste.

Second Embodiment

Next, a microreactor system according to a second embodiment of the present invention will be described with reference to the drawings.

Figure 5:
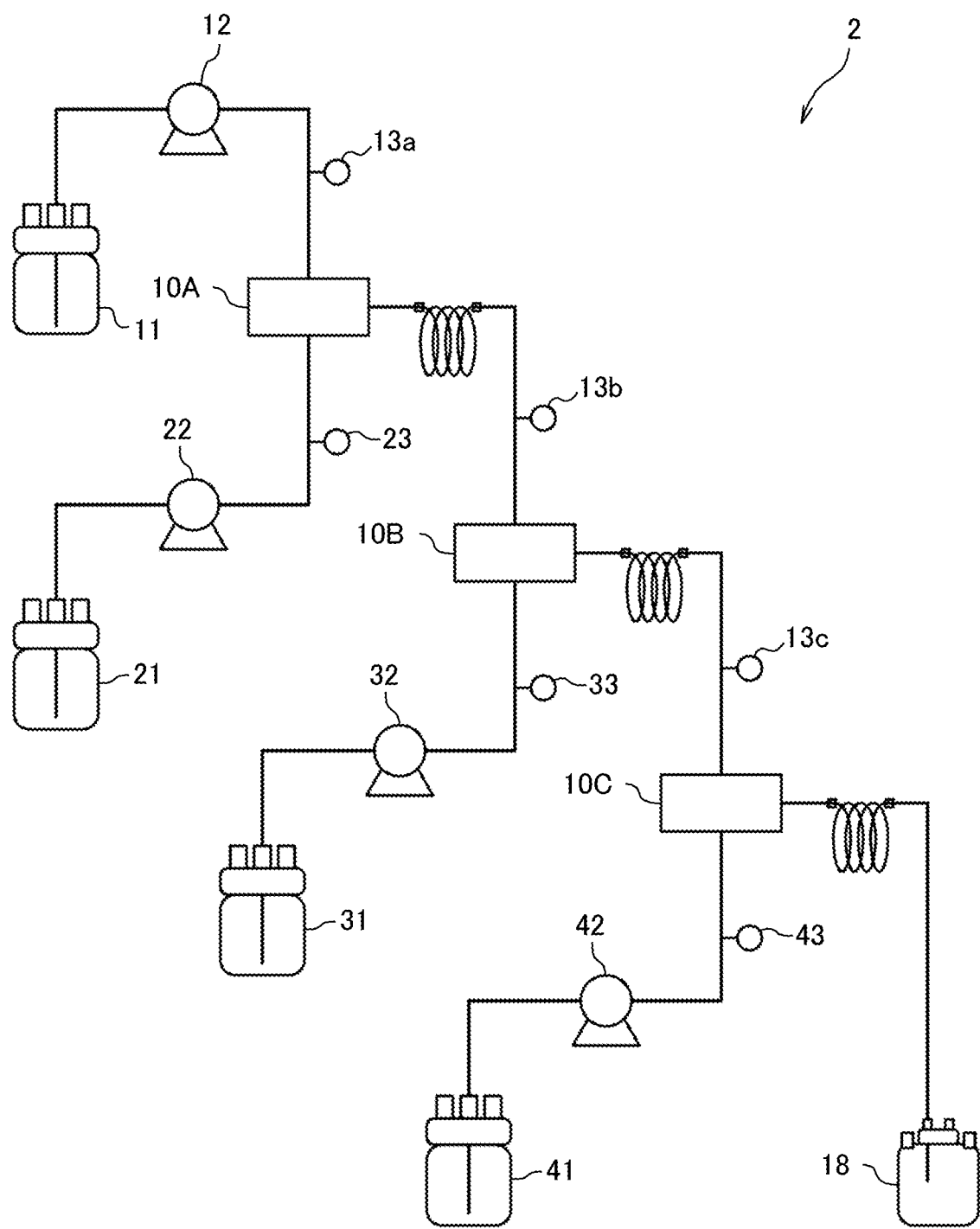
FIG. 5 is a schematic diagram of a microreactor system according to a second embodiment.

FIG. 5 is a schematic diagram of the microreactor system according to the second embodiment.

As shown in FIG. 5, the microreactor system. 2 according to the second embodiment includes a first-stage microreactor 10A, a plurality of microreactors (10B, 10C) in subsequent stages, a fluid A container 11, a fluid A pump (first-stage first fluid pump) 12, a fluid A detection sensor (fluid detector for the first-stage first fluid) 13a, a plurality of fluid detection sensors 13b, 13c for a mixed fluid (fluid detectors for a mixed fluid) in the subsequent stages, a fluid B container 21, a fluid B pump (first-stage second fluid pump) 22, a fluid B detection sensor (fluid detector for the first-stage second fluid) 23, and a fluid C container 31, a fluid C pump (pump for a fluid to be mixed) 32, a fluid C detection sensor (fluid detector for the fluid to be mixed) 33, a fluid D container 41, a fluid D pump 42 (pump for the fluid to be mixed), a fluid D detection sensor (fluid detector for the fluid to be mixed) 43, a recovery container 18, and a tube.

The microreactor system 2 shown in FIG. 5 includes the plurality of microreactors (10A, 10B, 10C) connected in series. The microreactor system. 2 mixes fluids sequentially introduced into the plurality of microreactors (10A, 10B, 10C) to generate a mixture of the fluids or a reaction product (mixed fluid) by a reaction of the fluids.

A first-stage microreactor 10A has two inlets into which fluids are introduced, a microchannel that merges and mixes the individually introduced fluids, and an outlet that allows the mixed fluid after the merging to flow out. A fluid A (first-stage first fluid) is introduced into the first-stage microreactor 10A from a first inlet. A fluid B (first-stage second fluid) is introduced from a second inlet.

In the first-stage microreactor 10A, the fluid A and the fluid B are primarily mixed to generate a primary mixed fluid (fluid A+B). The microreactor 10 shown in FIG. 2 is preferably used as the first-stage microreactor 10A.

A second-stage microreactor 10B is disposed in series downstream of the first-stage microreactor 10A. Similarly, the second-stage microreactor 10B has two inlets into which fluids are introduced, a microchannel that merges and mixes the individually introduced fluids, and an outlet that allows a mixed fluid after the merging to flow out. A primary mixed fluid (fluid A+B) is introduced into the second-stage microreactor 10B from a first inlet. A fluid C as a fluid to be mixed is introduced from a second inlet.

In the second-stage microreactor 10B, the primary mixed fluid (fluid A+B) and the fluid C are secondarily mixed to generate a secondary mixed fluid (fluid A+B+C). The microreactor 10 shown in FIG. 2 is preferably used as the second-stage microreactor 10B.

A third-stage microreactor 10C is disposed in series downstream of the second-stage microreactor 10B. Similarly, the third-stage microreactor 10C has two inlets into which fluids are introduced, a microchannel that merges and mixes the individually introduced fluids, and an outlet that allows a mixed fluid after the merging to flow out. The secondary mixed fluid (fluid A+B+C) is introduced into the third-stage microreactor 10C from a first inlet. Further, a fluid D as a fluid to be mixed is introduced from a second inlet.

In the third-stage microreactor 10C, the secondary mixed fluid (fluid A+B+C) and the fluid D are tertiary mixed to generate a tertiary mixed fluid (fluid A+B+C+D). The microreactor 10 shown in FIG. 2 is preferably used as the third-stage microreactor 10C.

As shown in FIG. 5, the fluid A container 11 that stores the prepared fluid A and the fluid A pump 12 that sends the fluid A toward the first inlet of the first-stage microreactor 10A are connected via the tube to the first inlet of the first-stage microreactor 10A. The fluid A container 11 is connected to the fluid A pump 12, and the fluid A pump 12 is connected to the first inlet of the first-stage microreactor 10A.

The fluid B container 21 that stores the prepared fluid B and the fluid B pump 22 that sends the fluid B toward the second inlet of the first-stage microreactor 10A are connected via the tube to the second inlet of the first-stage microreactor 10A. The fluid B container 21 is connected to the fluid B pump 22, and the fluid B pump 22 is connected to the second inlet of the first-stage microreactor 10A.

Further, the first inlet of the second-stage microreactor 10B is connected to the outlet of the first-stage microreactor 10A via the tube.

Similarly, the fluid C container 31 that stores the prepared fluid C and the fluid C pump 32 that sends the fluid C toward the second inlet of the second-stage microreactor 10B are connected via the tube to the second inlet of the second-stage microreactor 10B The fluid C container 31 is connected to the fluid C pump 32, and the fluid C pump 32 is connected to the second inlet of the second-stage microreactor 10B.

Further, the first inlet of the third-stage microreactor 10C is connected to the outlet of the second-stage microreactor 10B via a tube.

Similarly, the fluid D container 41 that stores the prepared fluid D and the fluid D pump 42 that sends the fluid D toward the second inlet of the third-stage microreactor 10C are connected via the tube to the second inlet of the third-stage microreactor 10C. The fluid D container 41 is connected to the fluid D pump 42, and the fluid D pump 42 is connected to the second inlet of the third-stage microreactor 10C.

Further, the recovery container 18 is connected to the outlet of the third-stage microreactor 10C via the tube.

As shown in FIG. 5, in the microreactor system 2, the fluid A detection sensor 13*a* is disposed near the first inlet of the first-stage microreactor 10A between the fluid A pump 12 and the first-stage microreactor 10A. The fluid A detection sensor 13*a* detects that the fluid A to be introduced from the first inlet of the first-stage microreactor 10A reaches the first inlet of the first-stage microreactor 10A.

Further, the fluid B detection sensor 23 is disposed near the second inlet of the first-stage microreactor 10A between the fluid B pump 22 and the first-stage microreactor 10A. The fluid B detection sensor 23 detects that the fluid B to be introduced from the second inlet of the first-stage microreactor 10A reaches the second inlet of the first-stage microreactor 10A.

Similarly, a primary mixed fluid detection sensor 13*b* is disposed near the first inlet of the second-stage microreactor 10B between the outlet of the first-stage microreactor 10A and the second-stage microreactor 10B. A secondary mixed fluid detection sensor 13*c* is disposed near the first inlet of the third-stage microreactor 10C between the outlet of the second-stage microreactor 10B and the third-stage microreactor 10C.

Meanwhile, a fluid C detection sensor 33 is disposed near the second inlet of the second-stage microreactor 10B between the fluid C pump 32 and the second-stage microreactor 10B. The fluid D detection sensor 43 is disposed near the second inlet of the third-stage microreactor 10C between the fluid D pump 42 and the third-stage microreactor 10C.

As the fluid A detection sensor 13*a*, the primary mixed fluid detection sensor 13*b*, the secondary mixed fluid detection sensor 13*c*, the fluid B detection sensor 23, the fluid C detection sensor 33, and the fluid D detection sensor 43, sensors similar to the first fluid detection sensor 113 and the second fluid detection sensor 123 are used.

Next, a specific operation method of the microreactor system 2 will be described.

In the microreactor system 2, the arrivals of the fluids at the inlets of the plurality of microreactors (10A, 10B, 10C) connected in series are sequentially detected by the fluid detection sensors (13*a*, 23, 13*b*, 33, 13*c*, 43). Then, similarly to the microreactor system 1, after the pipeline to the first inlet and the pipeline to the second inlet are both filled with the fluids, mixing by the introduction of the fluids into the microreactor 10 is started.

Specifically, in the first-stage microreactor 10A, the transfers (liquid feeding) of one of the first-stage fluids (first-stage first fluid: fluid A) and the other first-stage fluid (first-stage second fluid: fluid B) are temporarily stopped. Meanwhile, in the microreactors (10B, 10C) in the subsequent stages, the transfer (liquid feeding) of only the fluid to be mixed (fluid C, fluid D) of the mixed fluid (primary mixed fluid, secondary mixed fluid) and the fluid to be mixed (fluid C, fluid D) is temporarily stopped. In the microreactor system 2, any one of or a combination of the fluid A pump 12, the fluid B pump 22, the fluid C pump 32, and the fluid D pump 42 continues the transfer (liquid feeding) of the primary mixed fluid (A+B), the secondary mixed fluid (A+B+C), and the tertiary mixed fluid (A+B+C+D), and continues to operate without temporarily stopping the transfer (liquid feeding) thereof.

Figure 6:
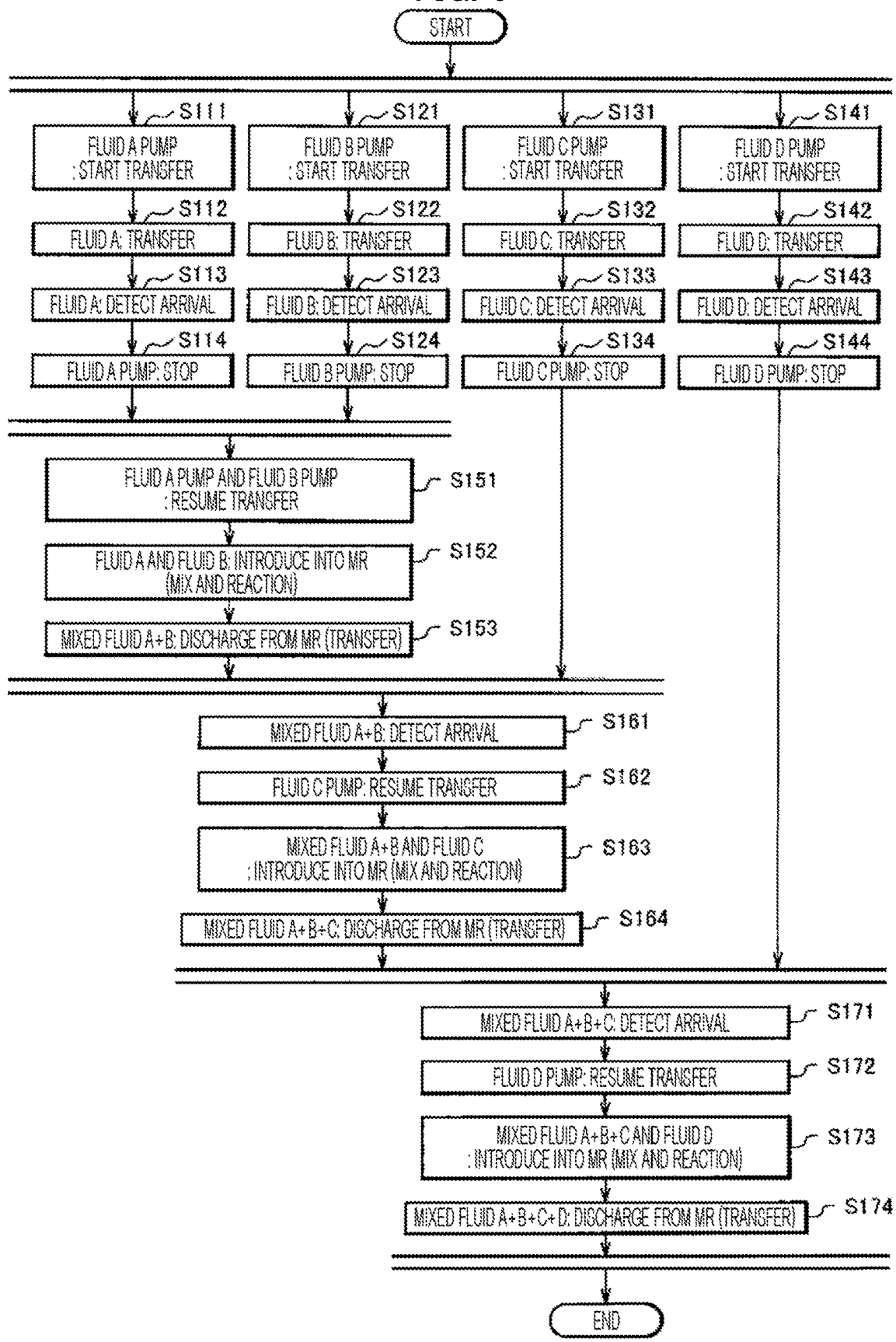
FIG. 6 is a flowchart showing an example of an operation method of the microreactor system according to the second embodiment.

FIG. 6 is a flowchart showing an example of an operation method of the microreactor system according to the second embodiment.

FIG. 6 shows an operation method based on an order of a series of microreactors (10A, 10B, 10C) included in the microreactor system 2.

In this operation method, the fluid A pump 12 starts the transfer of the fluid (step S111) for mixing the fluids. The fluid A is transferred through the tube from the fluid A container 11 toward the first inlet of the first-stage microreactor 10A (step S112) by the start of the operation of the fluid A pump 12.

After the transfer of the fluid A toward the first inlet of the first-stage microreactor 10A is started, when the leading end position of the fluid A reaches the first inlet of the first-stage microreactor 10A, the arrival of the fluid A is detected by the fluid A detection sensor 13*a* (step S113). A detection signal from the fluid A detection sensor 13*a* is transmitted to the control device.

Subsequently, the control device stops the fluid A pump 12 and stops the transfer of the fluid A (step S114) based on the detection by the fluid A detection sensor 13*a*. When the transfer of the fluid A is stopped, the pipeline to the first inlet of the first-stage microreactor 10A is filled with the fluid A of which transfer is stopped.

Further, for mixing the fluids, similarly to the fluid A, the fluid B is also transferred (fed) toward the second inlet of the first-stage microreactor 10A. When the leading end position of the fluid B reaches the second inlet of the first-stage microreactor 10A, the transfer (liquid feeding) of the fluid B is temporarily stopped.

Specifically, the transfer of the fluid by the fluid B pump 22 is started (step S121), and the fluid B is transferred toward the second inlet of the first-stage microreactor 10A (step S122). Then, after the transfer of the fluid B toward the second inlet of the first-stage microreactor 10A is started, the arrival of the fluid B is detected by the fluid B detection sensor 23 (step S123), the fluid B pump 22 is stopped by the detection, and the transfer of the fluid B is stopped (step S124). When the transfer of the fluid B is stopped, the pipeline to the second inlet of the first-stage microreactor 10A is filled with the fluid B of which transfer is stopped.

Subsequently, after the detection by the fluid A detection sensor 13a and after the detection by the fluid B detection sensor 23, each of the fluid A pump 12 and the fluid B pump 22 resumes the transfer based on the signal input from the control device (step S151). That is, after the fluid A pump 12 is temporarily stopped based on the detection and the transfer of the fluid A is stopped, and after the fluid B pump 22 is temporarily stopped and the transfer of the fluid B is stopped, the transfers of the fluids are resumed at an arbitrary time.

When the transfers are resumed, the stopped fluid A of which transfer has been temporarily stopped and the stopped fluid B of which transfer has been temporarily stopped at the inlets of the first-stage microreactor 10A are introduced into the first-stage microreactor 10A (step S152). Then, the fluid A and the fluid B merge with each other and start mixing or reacting.

Next, the primary mixed fluid (fluid A+B) after the merging is discharged from the outlet of the first-stage microreactor 10A (step S153). Subsequently, the primary mixed fluid (fluid A+B) is transferred through the tube from the first-stage microreactor 10A toward the first inlet of the second-stage microreactor 10B by the fluid A pump 12 and the fluid B pump 22.

As shown in FIG. 6, for mixing the fluids, similarly to the fluid B, the fluid C is also transferred (fed) toward the second inlet of the second-stage microreactor 10B. When the leading end position of the fluid C reaches the second inlet of the second-stage microreactor 10B, the transfer (liquid feeding) of the fluid C is temporarily stopped.

Specifically, the transfer of the fluid by the fluid C pump 32 is started (step S131), and the fluid C is transferred toward the second inlet of the second-stage microreactor 10B (step S132). Then, after the transfer of the fluid C toward the second inlet of the second-stage microreactor 10B is started, the arrival of the fluid C is detected by the fluid C detection sensor 33 (step S133), the fluid C pump 32 is stopped by the detection, and the transfer of the fluid C is stopped (step S134). When the transfer of the fluid C is stopped, the pipeline to the second inlet of the second-stage microreactor 10B is filled with the fluid C of which transfer is stopped.

The operation of transferring the fluid C and temporarily stopping the transfer of the fluid C may be performed before the transfer of the fluid A or the fluid B is started, or may be performed after the transfer of the fluid A or the fluid B is started and before the primary mixed fluid (fluid A+B) reaches the first inlet of the second-stage microreactor 10B.

Meanwhile, the fluid A pump 12 and the fluid B pump 22 continue to operate, and transfer the primary mixed fluid (fluid A+B) toward the first inlet of the second-stage microreactor 10B. When the leading end position of the primary mixed fluid (fluid A+B) reaches the first inlet of the second-stage microreactor 10B, the arrival of the primary mixed fluid (fluid A+B) is detected by the primary mixed fluid detection sensor 13b (step S161). A detection signal from the primary mixed fluid detection sensor 13b is transmitted to the control device.

Subsequently, after the detection by the fluid C detection sensor 33 and the detection by the primary mixed fluid detection sensor 13b, the fluid C pump 32 resumes the transfer based on the signal input from the control device (step S162). That is, after the fluid C pump 32 is temporarily stopped by the detection and the transfer of the fluid C is stopped, and after the detection by the primary mixed fluid detection sensor 13b, the transfer of the fluid is immediately resumed.

When the transfer is resumed, the primary mixed fluid (fluid A+B) being transferred and the stopped fluid C of which transfer has been temporarily stopped are introduced into the second-stage microreactor 10B (step S163). Then, the primary mixed fluid (fluid A+B) and the fluid C merge with each other and start mixing or reacting.

Next, the secondary mixed fluid (fluid A+B+C) after the merging is discharged from the outlet of the second-stage microreactor 10B (step S164). Subsequently, the secondary mixed fluid (fluid A+B+C) is transferred through the tube from the second-stage microreactor 10B toward the first inlet of the third-stage microreactor 10C by the fluid A pump 12, the fluid B pump 22, and the fluid C pump 32.

As shown in FIG. 6, for mixing the fluids, similarly to the fluid B and the fluid C, the fluid D is also transferred (fed) toward the second inlet of the third-stage microreactor 10C. When the leading end position of the fluid D reaches the second inlet of the third-stage microreactor 10C, the transfer (liquid feeding) of the fluid D is temporarily stopped.

Specifically, the transfer of the fluid by the fluid D pump 42 is started (step S141), and the fluid D is transferred toward the second inlet of the third-stage microreactor 10C (step S142). Then, after the transfer of the fluid D toward the second inlet of the third-stage microreactor 10C is started, the arrival of the fluid D is detected by the fluid D detection sensor 43 (step S143), the fluid D pump 42 is stopped by the detection, and the transfer of the fluid D is stopped (step S144). When the transfer of the fluid D is stopped, the pipeline to the second inlet of the third-stage microreactor 10C is filled with the fluid D of which transfer is stopped.

The operation of transferring the fluid D and temporarily stopping the transfer of the fluid D may be performed before the transfer of the fluid A, the fluid B, or the fluid C is started, or may be performed after the transfer of the fluid A, the fluid B, or the fluid C is started and before the secondary mixed fluid (fluid A+B+C) reaches the first inlet of the third-stage microreactor 10C.

Meanwhile, the fluid A pump 12, the fluid B pump 22, and the fluid C pump 32 continue to operate, and transfer the secondary mixed fluid (fluid A+B+C) toward the first inlet of the third-stage microreactor 10C. When the leading end position of the secondary mixed fluid (fluid A+B+C) reaches the first inlet of the third-stage microreactor 10C, the arrival of the secondary mixed fluid (fluid A+B+C) is detected by the secondary mixed fluid detection sensor 13c (step S171). A detection signal from the secondary mixed fluid detection sensor 13c is transmitted to the control device.

Subsequently, after the detection by the fluid D detection sensor 43 and after the detection by the secondary mixed fluid detection sensor 13c, the fluid D pump 42 resumes the transfer based on the signal input from the control device (step S172). That is, after the fluid D pump 42 is temporarily stopped by the detection and the transfer of the fluid D is stopped, and after the detection by the secondary mixed fluid detection sensor 13c, the transfer of the fluid is immediately resumed.

When the transfer is resumed, the secondary mixed fluid (fluid A+B+C) being transferred and the stopped fluid D of which transfer has been temporarily stopped are introduced into the third-stage microreactor 10C (step S173). Then, the secondary mixed fluid (fluid A+B+C) and the fluid D merge with each other and start mixing or reacting.

Next, the tertiary mixed fluid (fluids A+B+C+D) after the merging is discharged from the outlet of the third-stage microreactor 10C (step S174). Subsequently, the tertiary mixed fluid (fluids A+B+C+D) is recovered in the recovery container 18.

In the above microreactor system 2 and the operation method thereof, the pipelines to the inlets of the microreactors can be filled with the fluids immediately before the fluids are mixed, while the mixed fluids are kept flowing. Thus, the leading end positions of the fluids can be easily controlled until immediately before mixing. As a result, the timing at which the fluids reach the junction can be substantially controlled, and the timing can be synchronized by the control. Therefore, in the microreactor system 2, three or more types of fluids can be continuously mixed at precise timing.

Third Embodiment

Next, a microreactor system according to a third embodiment of the present invention will be described with reference to the drawings.

Figure 7:
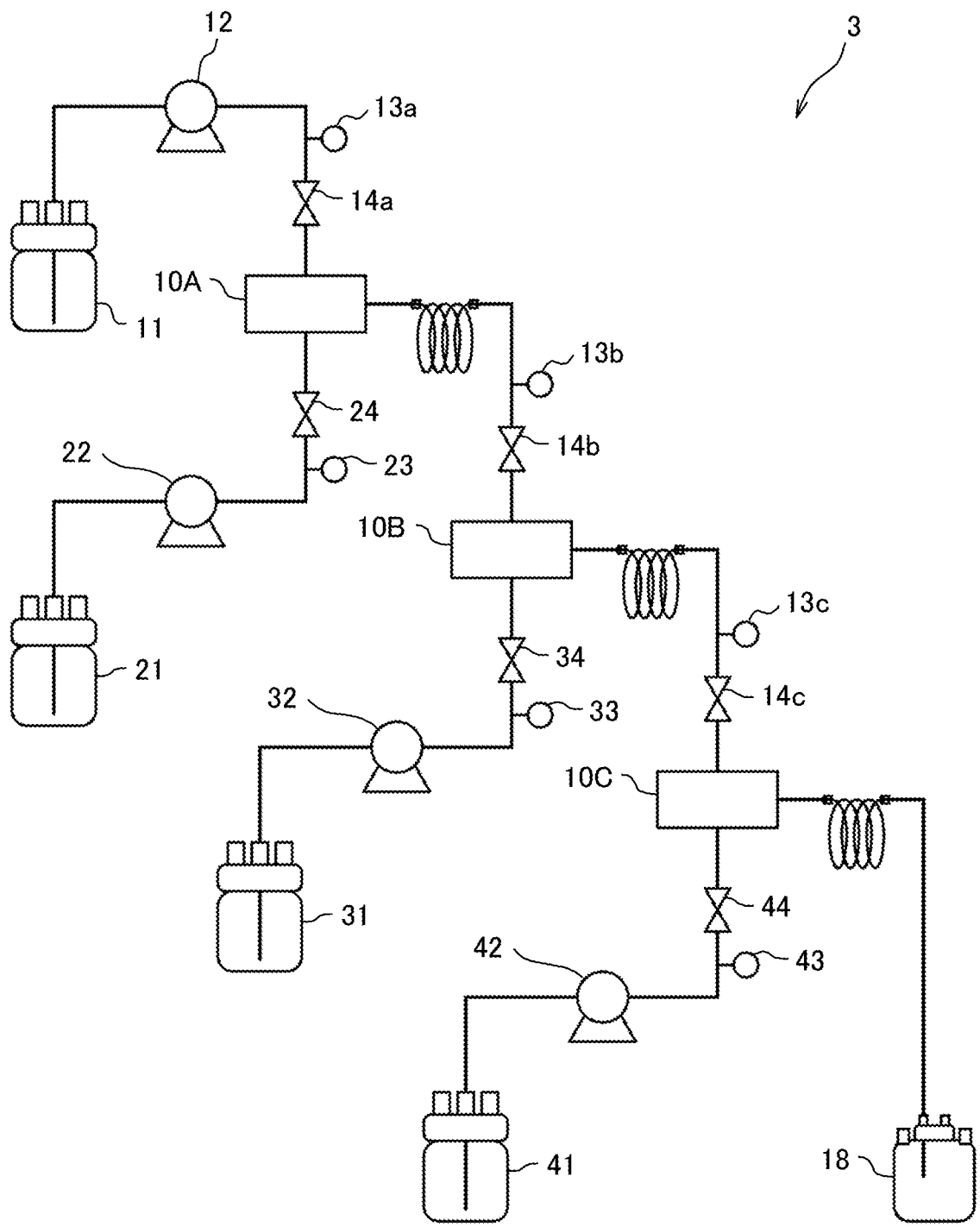
FIG. 7 is a schematic diagram of a microreactor system according to a third embodiment.

FIG. 7 is a schematic diagram of the microreactor system according to the third embodiment.

As shown in FIG. 7, similarly to the microreactor system 2, the microreactor system 3 according to the third embodiment includes the plurality of microreactors (10A, 10B, 10C) connected in series, the fluid containers (11, 21, 31, 41), the fluid pumps (12, 22, 32, 42), the fluid detection sensors (13a, 13b, 13c, 23, 33, 43), the recovery container 18, and the tube.

The microreactor system 3 according to the third embodiment is different from the microreactor system 2 in that valves (14a, 14b, 14c, 24, 34, 44) are further provided at the inlets of the microreactors (10A, 10B, 10C).

In the microreactor system 3, a fluid A valve 14a is provided between the fluid A detection sensor 13a and the first-stage microreactor 10A. A primary mixed fluid valve 14b is provided between the outlet of the first-stage microreactor 10A and the second-stage microreactor 10B. A secondary mixed fluid valve 14c is provided between the outlet of the second-stage microreactor 10B and the third-stage microreactor 10C.

Further, a fluid B valve 24 is provided between the fluid B detection sensor 23 and the first-stage microreactor 10A. A fluid C valve 34 is provided between the fluid C detection sensor 33 and the second-stage microreactor 10B. A fluid D valve 44 is provided between the fluid D detection sensor 43 and the third-stage microreactor 10C.

As the fluid A valve 14a, the primary mixed fluid valve 14b, the secondary mixed fluid valve 14c, the fluid B valve 24, the fluid C valve 34, and the fluid D valve 44, an appropriate valve such as a gate valve, a butterfly valve, a stop valve, and a pinch valve is used. As a single-use valve, a pinch valve is particularly preferably used because only a tube touches liquid.

The fluid A valve 14a, the primary mixed fluid valve 14b, the secondary mixed fluid valve 14c, the fluid B valve 24, the fluid C valve 34, and the fluid D valve 44 are closed from an open state with the stop of the fluid pumps (12, 22, 32, 42) when the arrivals of the fluids at the inlets of the microreactors (10A, 10B, 10C) are detected by the fluid detection sensors (13a, 13b, 13c, 23, 33, 43). Then, with the start of the transfer at the fluid A pump 12, the fluid A valve 14a, the primary mixed fluid valve 14b, and the secondary mixed fluid valve 14c are turned from the closed state to the open state. With the start of the transfer at the fluid B pump 22, the fluid B valve 24, the primary mixed fluid valve 14b, and the secondary mixed fluid valve 14c are turned from the closed state to the open state. With the start of the transfer at the fluid C pump 32, the fluid C valve 34 and the secondary mixed fluid valve 14c are turned from the closed state to the open state. With the start of the transfer at the fluid D pump 42, the fluid D valve 44 is turned from the closed state to the open state.

In the above microreactor system 3 and the operation method thereof, the transfers of the fluids are reliably stopped at the inlets of the microreactors, and the leading end positions of the fluids introduced into the microreactors are reliably arranged. As a result, the fluids can be mixed at more precise timing. In particular, even when a large flow rate difference occurs between the fluids, such as when the mixing ratio is biased toward one of the fluids, a backflow at the junctions of the microreactors can be reliably prevented.

Fourth Embodiment

Next, a microreactor system according to a fourth embodiment of the present invention will be described with reference to the drawings.

Figure 8:
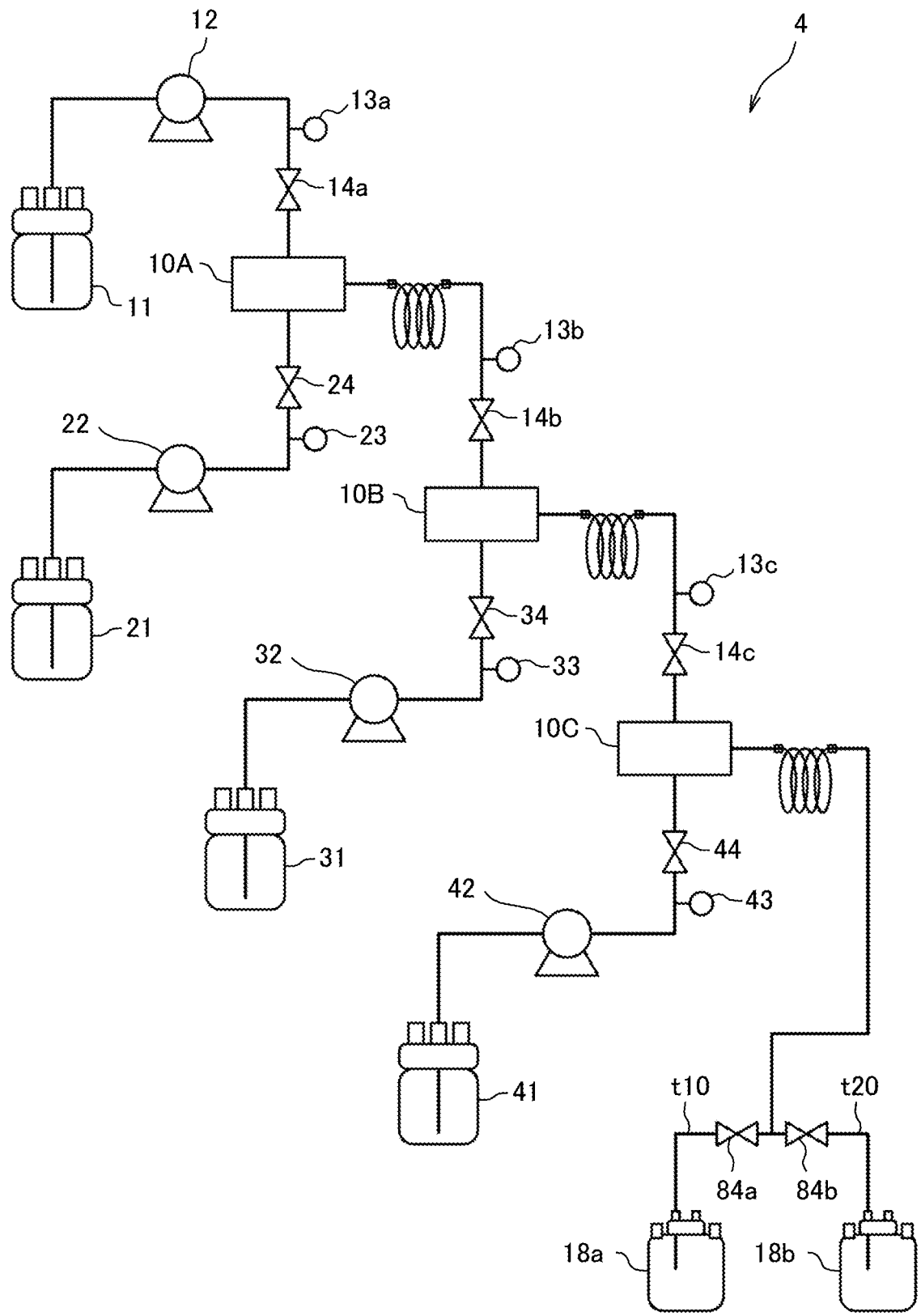
FIG. 8 is a schematic diagram of a microreactor system according to a fourth embodiment.

FIG. 8 is a schematic diagram of the microreactor system according to the fourth embodiment.

As shown in FIG. 8, similarly to the microreactor system 3, the microreactor system 4 according to the fourth embodiment includes the plurality of microreactors (10A, 10B, 10C) connected in series, the fluid containers (11, 21 31, 41), the fluid pumps (12, 22, 32, 42), the fluid detection sensors (13a, 13b, 13c, 23, 33, 43), the tube, and the valves (14a, 14b, 14c, 24, 34, 44).

The microreactor system 4 according to the fourth embodiment is different from the microreactor system 3 in that a recovery pipe (recovery path) t10 that recovers the mixed fluid and a disposal pipe (disposal path) t20 that discards the fluid are branched and connected downstream of the microreactor 10C in the final stage, a recovery valve 84a and a recovery container 18a are provided in the recovery pipe t10, and a disposal valve 84b and a disposal container 18b are provided in a disposal pipe t20.

The recovery pipe t10 is branched downstream of the outlet of the microreactor 10C in the final stage, and the recovery valve 84a is disposed near a branch point. Further, the recovery container 18a is disposed downstream of the recovery pipe t10. In the recovery container 18a, the mixed fluid mixed in a plurality of microreactors (10A, 10B, 10C) connected in series is recovered.

Meanwhile, the disposal pipe t20 is branched downstream of the outlet of the microreactor 10C in the final stage, and the disposal valve 84b is disposed near the branch point. Further, the disposal container 18b is disposed downstream of the disposal pipe t20. In the disposal container 18b, the fluid that has not been mixed at an appropriate mixing ratio is discarded instead of being recovered in the recovery container 18a.

Figure 9:
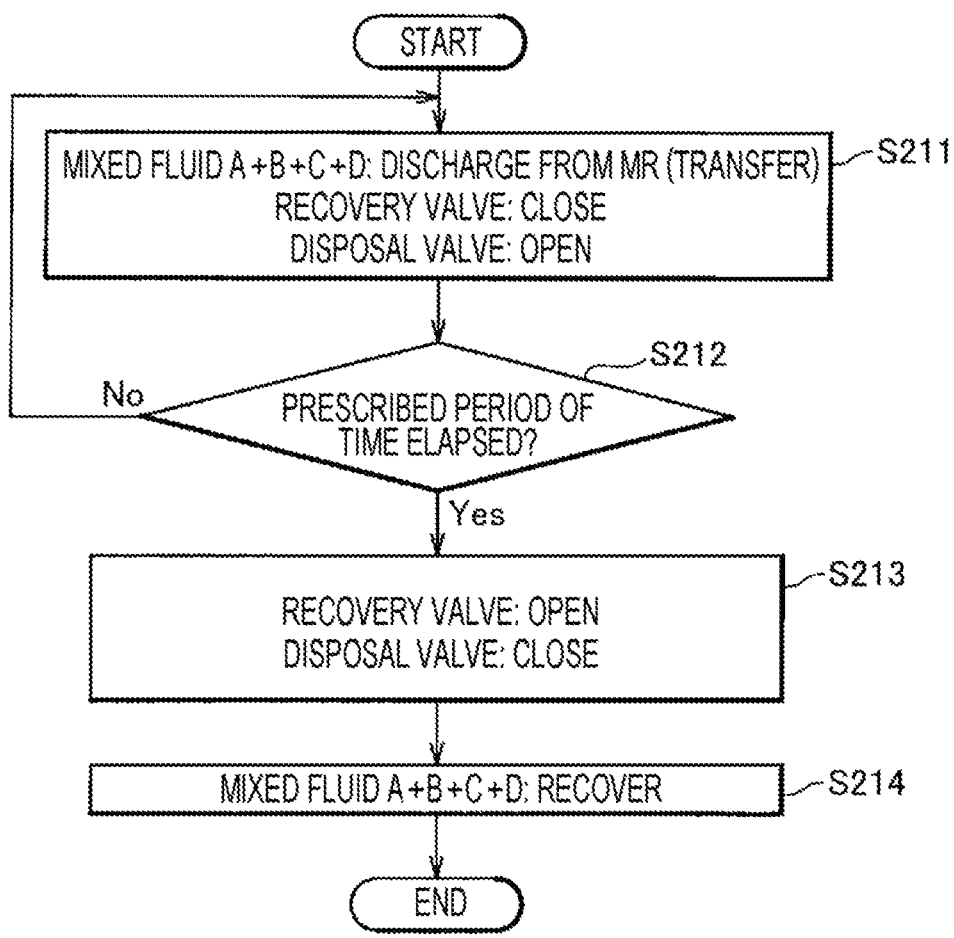
FIG. 9 is a flowchart showing an example of an operation method of the microreactor system according to the fourth embodiment.

FIG. 9 is a flowchart showing an example of an operation method of the microreactor system according to the fourth embodiment.

FIG. 9 shows an operation method performed in the microreactor system 4 at an initial stage of mixing after the fluid mixing is started.

In this operation method, similarly to the operation method of the microreactor system 2, the fluid mixing is started while the pipelines to the inlets of the plurality of microreactors (10A, 10B, 10C) connected in series are filled with the fluid. At the initial stage after the fluid mixing is started, the recovery valve 84a is closed, and the disposal valve 84b is open.

At the initial stage after the fluid mixing is started, the tertiary mixed fluid (fluid A+B+C+D) after the merging is discharged from the outlet of the third-stage microreactor 10C and discarded in the disposal container 18b through the disposal pipe t20 (step S211).

Next, while the tertiary mixed fluid (fluid A+B+C+D) is being discarded in the disposal container 18b, the control device determines whether or not a prescribed period of time has elapsed (step S212). For example, based on an elapsed time after the fluid pumps (12, 22, 32, 42) start transferring the fluids, an elapsed time after the secondary mixed fluid detection sensor 13c detects the arrival of the fluid, and the like, it is determined whether or not the mixing at the initial stage in which the mixing ratio is likely to be unstable has ended.

When the prescribed period of time has not elapsed (step S212; NO), there is a possibility that the mixed fluid having a mixing ratio deviating from a desired mixing ratio may be recovered. Thus, the control device returns the processing to step S211.

On the other hand, when the prescribed period of time has elapsed (step S212; YES), there is a low possibility that the mixed fluid having a mixing ratio deviating from the desired mixing ratio may be recovered. Thus, the control device advances the processing to step S213.

Next, in step S213, the control device opens the closed recovery valve 84a and closes the open disposal valve 84b (step S213). In a valve switching operation, the disposal valve 84b may be closed after the recovery valve 84a is opened and the disposal valve 84b is kept open for a certain period of time. This operation can prevent pressure in the system from rapidly increasing.

Then, the tertiary mixed fluid (fluid A+B+C+D) after the merging discharged from the third-stage microreactor 10C is recovered in the recovery container 18a through the recovery pipe t10 by the valve switching operation (Step S214).

In the above microreactor system 4 and the operation method thereof, the mixed fluid having a mixing ratio deviating from the desired mixing ratio that may be obtained at the initial stage after the fluid mixing is started can be discarded without being recovered. That is, only the mixed fluid mixed at the desired mixing ratio can be recovered in a high yield.

Fifth Embodiment

Next, a microreactor system according to a fifth embodiment of the present invention will be described with reference to the drawings.

Figure 10:
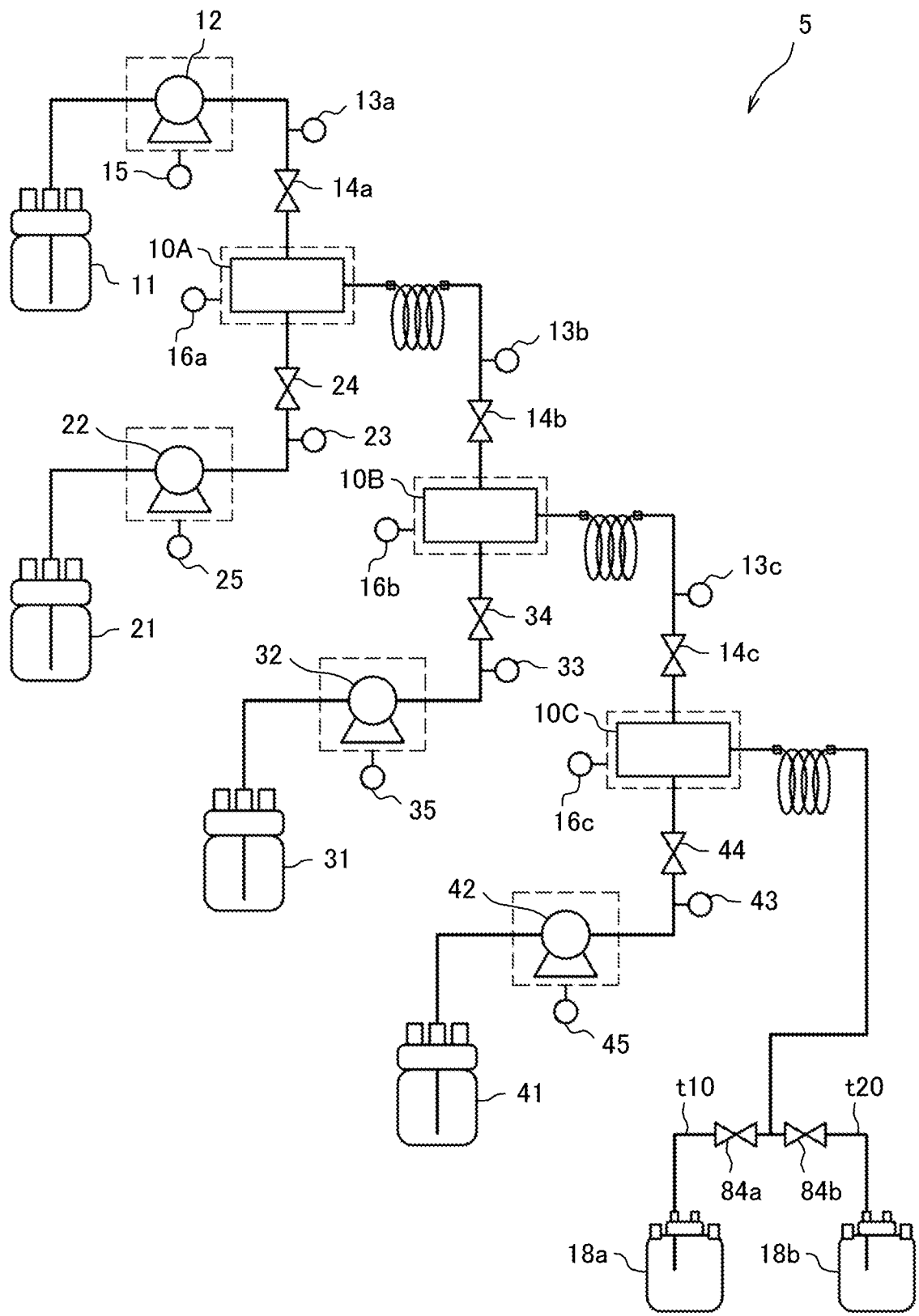
FIG. 10 is a schematic diagram of a microreactor system according to a fifth embodiment.

FIG. 10 is a schematic diagram of the microreactor system according to the fifth embodiment.

As shown in FIG. 10, similarly to the microreactor system 4, the microreactor system 5 according to the fifth embodiment includes the plurality of microreactors (10A, 10B, 10C) connected in series, the fluid containers (11, 21, 31, 41), the fluid pumps (12, 22, 32, 42), the fluid detection sensors (13a, 13b, 13c, 23, 33, 43), the tube, and the valves (14a, 14b, 14c, 24, 34, 44, 84a, 84b), the recovery container 18a, and the disposal container 18b.

The microreactor system 5 according to the fifth embodiment is different from the microreactor system 4 in that the microreactors (10A, 10B, 10C) and the fluid pumps (12, 22, 32, 42) respectively include leak detection sensors (leak detectors) (16a, 16b, 16c, 15, 25, 35, 45) that detect a fluid leak.

In the microreactor system 5, as shown by broken lines in FIG. 10, the first-stage microreactor 10A is provided with a first leak detection sensor 16a, the second-stage microreactor 10B is provided with a second leak detection sensor 16b, and the third-stage microreactor 10C is provided with a third leak detection sensor 16c. Further, the fluid A pump 12 is provided with a fluid A leak detection sensor 15, the fluid B pump 22 is provided with a fluid B leak detection sensor 25, the fluid C pump 32 is provided with a fluid C leak detection sensor 35, and the fluid D pump 42 is provided with a fluid D leak detection sensor 45.

As the leak detection sensors (16a, 16b, 16c, 15, 25, 35, 45), for example, an appropriate detector of a method such as an inter-electrode resistance detection method, an optical method, a flow rate detection method, or a weight detection method can be used.

In the above microreactor system 5 and the operation method thereof, the fluid leak that may occur in the microreactors or the pumps can be detected by the leak detection sensors. This can reliably prevent the leak of the fluid from the microreactors or the pumps and the recovery of the mixed fluid mixed with a mixing ratio deviating from the desired mixing ratio.

Sixth Embodiment

Next, a microreactor system according to a sixth embodiment of the present invention will be described with reference to the drawings.

Figure 11:
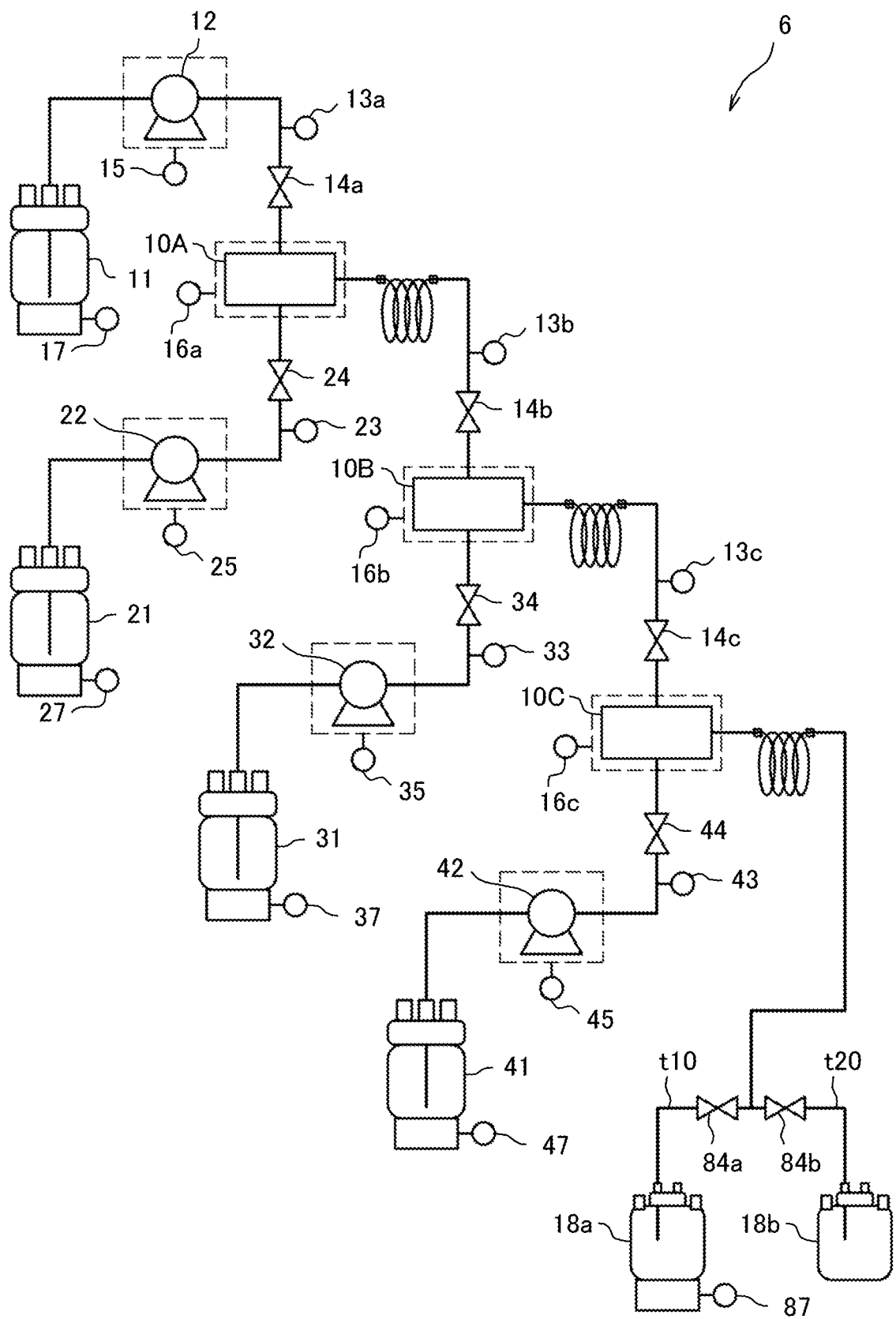
FIG. 11 is a schematic diagram of a microreactor system according to a sixth embodiment.

FIG. 11 is a schematic diagram of the microreactor system according to the sixth embodiment.

As shown in FIG. 11, similarly to the microreactor system 5, the microreactor system 6 according to the sixth embodiment includes the plurality of microreactors (10A, 10B, 10C) connected in series, the fluid containers (11, 21, 31, 41), the fluid pumps (12, 22, 32, 42), the fluid detection sensors (13a, 13b, 13c, 23, 33, 43), the tube, the valves (14a, 14b, 14c, 24, 34, 44, 84a, 84b), the recovery container 18a, the disposal container 18b, and the leak detection sensors (16a, 16b, 16c, 15, 25, 35, 45).

The microreactor system 6 according to the sixth embodiment is different from the microreactor system 5 in that the microreactor system 6 includes weight sensors (first weight detectors) (17, 27, 37, 47) for the fluid to be mixed that respectively detect a change in weight of the fluids introduced into the microreactors (10A, 10B, 10C), and a mixed fluid weight sensor (second weight detector) 87 that detects a change in weight of the mixed fluid recovered from the microreactor 10C.

In the microreactor system 6, as shown in FIG. 11, a fluid A weight sensor 17 that measures a weight of the fluid A prepared in the fluid A container 11, a fluid B weight sensor 27 that measures a weight of the fluid B prepared in the fluid B container 21, a fluid C weight sensor 37 that measures a weight of the fluid C prepared in the fluid C container 31, and a fluid D weight sensor 47 that measures a weight of the fluid D prepared in the fluid D container 41 are provided with the fluid containers (11, 21, 31, 41) mounted thereon, respectively.

Further, the mixed fluid weight sensor 87 that measures a weight of the tertiary mixed fluid (fluid A+B+C+D) recovered in the recovery container 18a is provided with the recovery container 18a mounted thereon. The weight sensors (17, 27, 37, 47) for the fluid to be mixed and the mixed fluid weight sensor 87 are configured by, for example, an electronic balance, but may be a load sensor (load cell) or the like that detects a change in weight based on a load. Further, the weight sensors (17, 27, 37, 47) for the fluid to be mixed and the mixed fluid weight sensor 87 may be provided with the containers suspended therefrom instead of having the containers mounted thereon, respectively. The weight sensors (17, 27, 37, 47) for the fluid to be mixed and the mixed fluid weight sensor 87 are used to measure a decrease per hour in a total weight of the fluids A, B, C, and D and an increase per hour in the mixed fluid that is recovered. Therefore, a mass balance is recognized from moment to moment.

Figure 12:
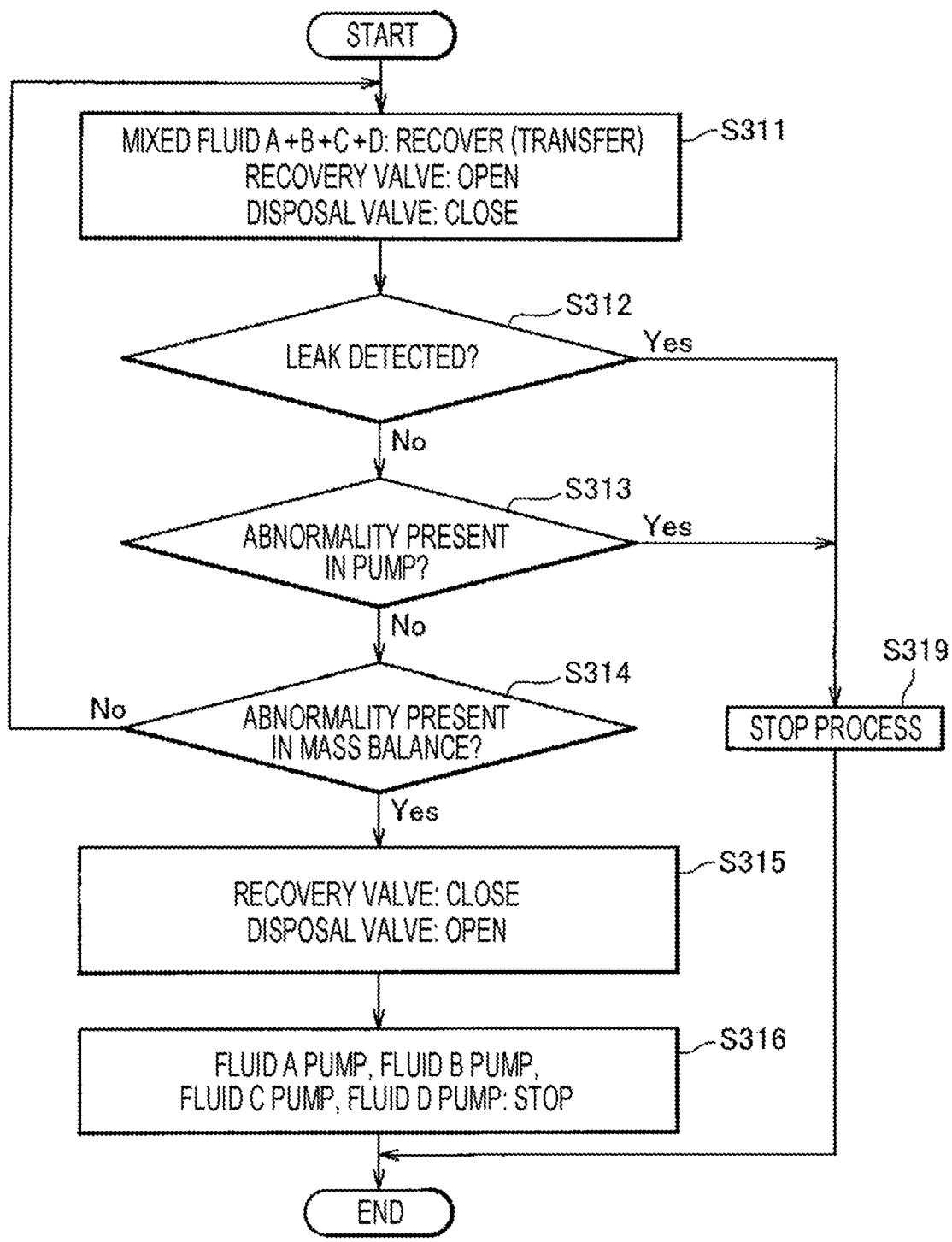
FIG. 12 is a flowchart showing an example of an operation method of the microreactor system according to the sixth embodiment.

FIG. 12 is a flowchart showing an example of an operation method of the microreactor system according to the sixth embodiment.

FIG. 12 shows an operation method performed in the microreactor system 6 when the fluid mixing is continued after the fluid mixing is started.

In this operation method, similarly to the operation method of the microreactor system 2, the fluid mixing is started while the pipelines to the inlets of the plurality of microreactors (10A, 10B, 10C) connected in series are filled with the fluid. When the fluid mixing is continued after the initial stage ends, the recovery valve 84a is open and the disposal valve 84b is closed.

When the fluid mixing is continued, the tertiary mixed fluid (fluid A+B+C+D) after the merging is discharged from the outlet of the third-stage microreactor 10C, and recovered in the recovery container 18a through the recovery pipe t10 (step S311).

Next, while the tertiary mixed fluid (fluid A+B+C+D) is being collected in the recovery container 18a, the control device determines whether or not a fluid leak is detected (step S312). Specifically, it is determined whether any of the first leak detection sensor 16a, the second leak detection sensor 16b, the third leak detection sensor 16c, the fluid A leak detection sensor 15, the fluid B leak detection sensor 25, the fluid C leak detection sensor 35, and the fluid D leak detection sensor 45 has detected a fluid leak from the microreactors or the pumps, and whether or not the fluid detection sensors (13a, 13b, 13c, 23, 33, 43) has detected an abnormality in the fluid flow.

When any fluid leak has been detected (step S312; YES), there is a possibility that the mixed fluid having a mixing ratio deviating from the desired mixing ratio may be recovered. Thus, the control device advances the processing to step S319.

On the other hand, when no fluid leak is detected (step S312; NO), there is a low possibility that the mixed fluid having a mixing ratio deviating from the desired mixing ratio may be recovered. Thus, the control device advances the processing to step S313.

Next, in step S313, the control device determines whether or not there is an abnormality in the pumps (step S313). For example, it is determined whether any of the fluid pumps (12, 22, 32, 42) has lost synchronism based on a change in the flow rate of the fluid or the like.

When there is an abnormality in the pumps (step S313; YES), there is a possibility that the mixed fluid having a mixing ratio deviating from the desired mixing ratio may be recovered. Thus, the control device advances the processing to step S319.

Next, in step S319, the control device stops the operation of the microreactor system 6 (step S319). Since it is difficult to recover the mixed fluid having the desired mixing ratio due to a fluid leak from the microreactors or the pumps, the processing proceeds to a predetermined stop process, and the operation of the microreactor system 6 ends.

Table 1 below shows assumed abnormal locations (abnormality detection positions), specific phenomena, and countermeasures to be taken when the fluid detection sensors (13a, 13b, 13c, 23, 33, 43) each detect an abnormality in the fluid flow. For example, when the processing proceeds to the predetermined stop process according to the countermeasures shown in Table 1, and the fluid corresponding to a leaking part is first stopped, the backflow of the fluid and a mixing of a large amount of fluid into the mixed fluid to be recovered are prevented.

TABLE 1

| Detection means | Abnormality detection positions | Phenomena | Countermeasures |
|---|---|---|---|
| Fluid A detection sensor (13a) | Fluid A pump (12) - microreactor (10A) | Fluid A is not introduced. Fluid B flows back to fluid A. | 1) Close recovery valve (84a), open disposal valve (84b). 2) Stop fluid A pump (12). 3) Close fluid A valve (14a). 4) Stop fluid B, C, D pumps (22, 32, 42). |
| Fluid B detection sensor (23) | Fluid B pump (22) - microreactor (10A) | Fluid B is not introduced. Fluid A flows back to fluid B. | 1) Close recovery valve (84a), open disposal valve (84b). 2) Stop fluid B pump (22). 3) Close fluid B valve (24). 4) Stop fluid A, C, D pumps (12, 32, 42). |
| Primary mixed fluid detection sensor (13b) | Microreactor (10A) - microreactor (10B) | Mixed fluid A + B is not introduced. Fluid C flows back to mixed fluid A + B. | 1) Close recovery valve (84a), open disposal valve (84b). 2) Stop fluid A, B pumps (12, 22). 3) Close primary mixed fluid valve (14b). 4) Stop fluid C, D pumps (32, 42). |
| Fluid C | Fluid C pump (32) - | Fluid C is not | 1) Close recovery valve (84a), open |

TABLE 1-continued

| Detection means | Abnormality detection positions | Phenomena | Countermeasures |
|---|---|---|---|
| detection sensor (33) | microreactor (10B) | introduced. Mixed fluid A + B flows back to fluid C. | disposal valve (84b). 2) Stop fluid C pump (32). 3) Close fluid C valve (34). 4) Stop fluid A, B, D pumps (12, 22, 42). |
| Secondary mixed fluid detection sensor (13c) | Microreactor (10B) - microreactor (10C) | Mixed fluid A + B + C is not introduced. Fluid D flows back to mixed fluid A + B + C. | 1) Close recovery valve (84a), open disposal valve (84b). 2) Stop fluid A, B, C pumps (12, 22, 32). 3) Close secondary mixed fluid valve (14c). 4) Stop fluid D pump (42). |
| Fluid D detection sensor (43) | Fluid D pump (42) - microreactor (10C) | Fluid D is not introduced. Mixed fluid A + B + C flows back to fluid D. | 1) Close recovery valve (84a), open disposal valve (84b). 2) Stop fluid D pump (42). 3) Close fluid D valve (44). 4) Stop fluid A, B, C pumps (12, 22, 32). |

On the other hand, when there is no abnormality in the pumps (step S313; NO), there is a low possibility that the mixed fluid having a mixing ratio deviating from the desired mixing ratio may be recovered. Thus, the control device advances the processing to step S314.

Next, in step S314, the control device determines whether or not there is an abnormality in the mass balance between the decrease per hour in the total weight of the fluids A, B, C, and D and the increase per hour in the weight of the mixed fluid that is recovered (step S314). Specifically, whether or not the mass balance is maintained is determined based on the decrease per hour in the total weight of the prepared fluids A, B, C, and D measured by the weight sensors (17, 27, 37, 47) for the fluid to be mixed, and the increase per hour in the weight of the final tertiary mixed fluid (fluid A+B+C+D) measured by the mixed fluid weight sensor 87.

When there is no abnormality in the mass balance (step S314; NO), there is a low possibility that the mixed fluid having a mixing ratio deviating from the desired mixing ratio may be recovered. Thus, the control device returns the processing to step S311.

On the other hand, when there is an abnormality in the mass balance (step S314; YES), there is a possibility that a mixed fluid deviating from the desired mixing ratio may be recovered. Thus, the control device advances the processing to step S315.

Next, in step S315, the control device closes the open recovery valve 84a and opens the closed disposal valve 84b (step S315). The tertiary mixed fluid (fluids A+B+C+D) of which mixing ratio may deviate from the desired mixing ratio is discarded in the disposal container 18b through the disposal pipe t20.

Subsequently, the control device stops the fluid A pump 12, the fluid B pump 22, the fluid C pump 32, and the fluid D pump 42, stops the transfer of the fluids A, B, C, and D, and stops the transfers of the primary mixed fluid (fluid A+B), the secondary mixed fluid (fluid A+B+C), and the tertiary mixed fluid (fluid A+B+C+D) (step S316). At this time, the fluid A valve 14a, the fluid B valve 24, the fluid C valve 34, and the fluid D valve 44 are also closed as necessary. Subsequently, the operation of the microreactor system 6 ends.

In the above microreactor system 6 and the operation method thereof, a fluid leak can be recognized not based on the leak detection sensors but based on the change in the mass balance. Therefore, it is possible to detect a leak from a location where the leak detection sensors are not disposed or a location where the leak detection sensors cannot be disposed.

Seventh Embodiment

Next, a microreactor system according to a seventh embodiment of the present invention will be described with reference to the drawings.

Figure 13:
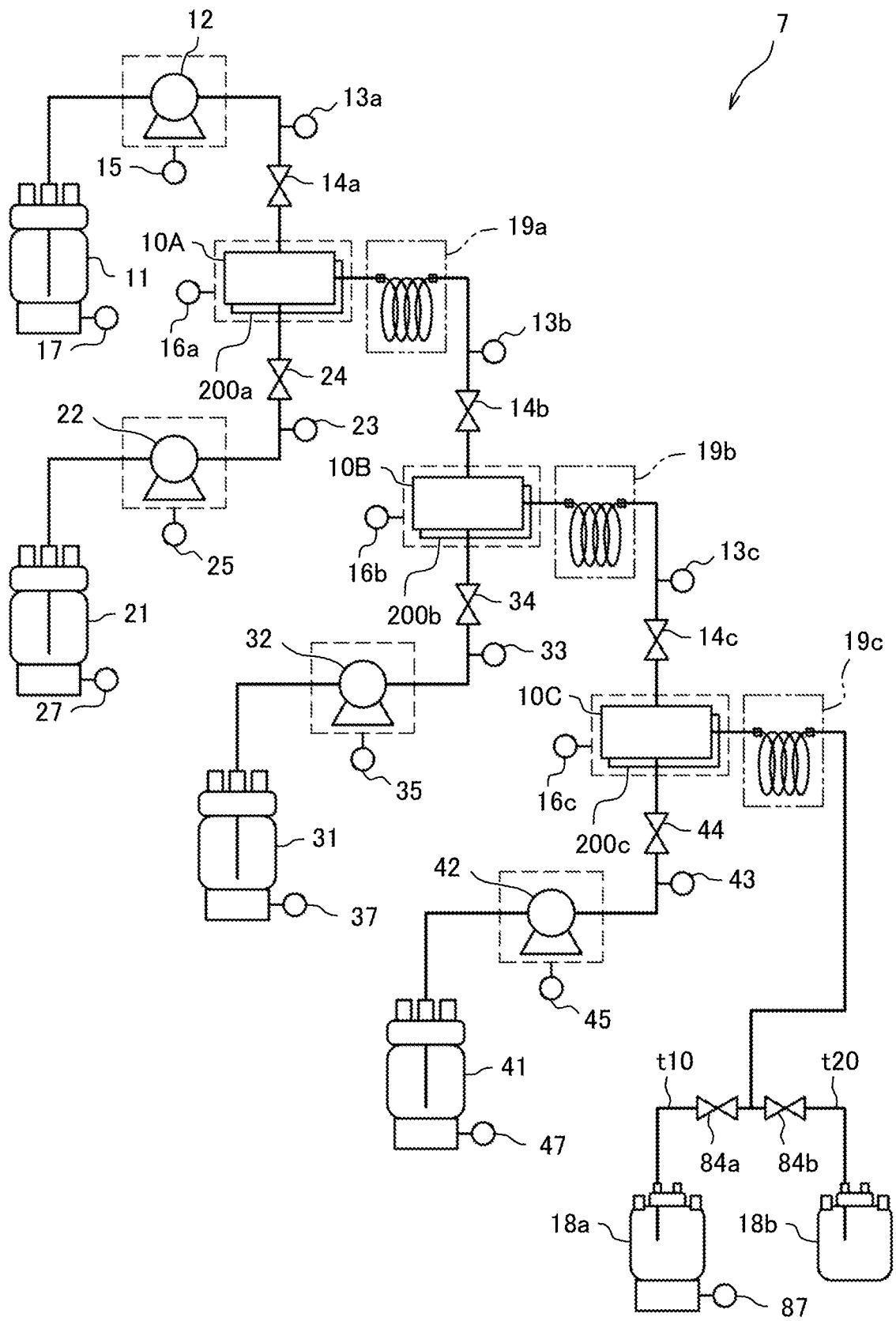
FIG. 13 is a schematic diagram of a microreactor system according to a seventh embodiment.
Figure 14:
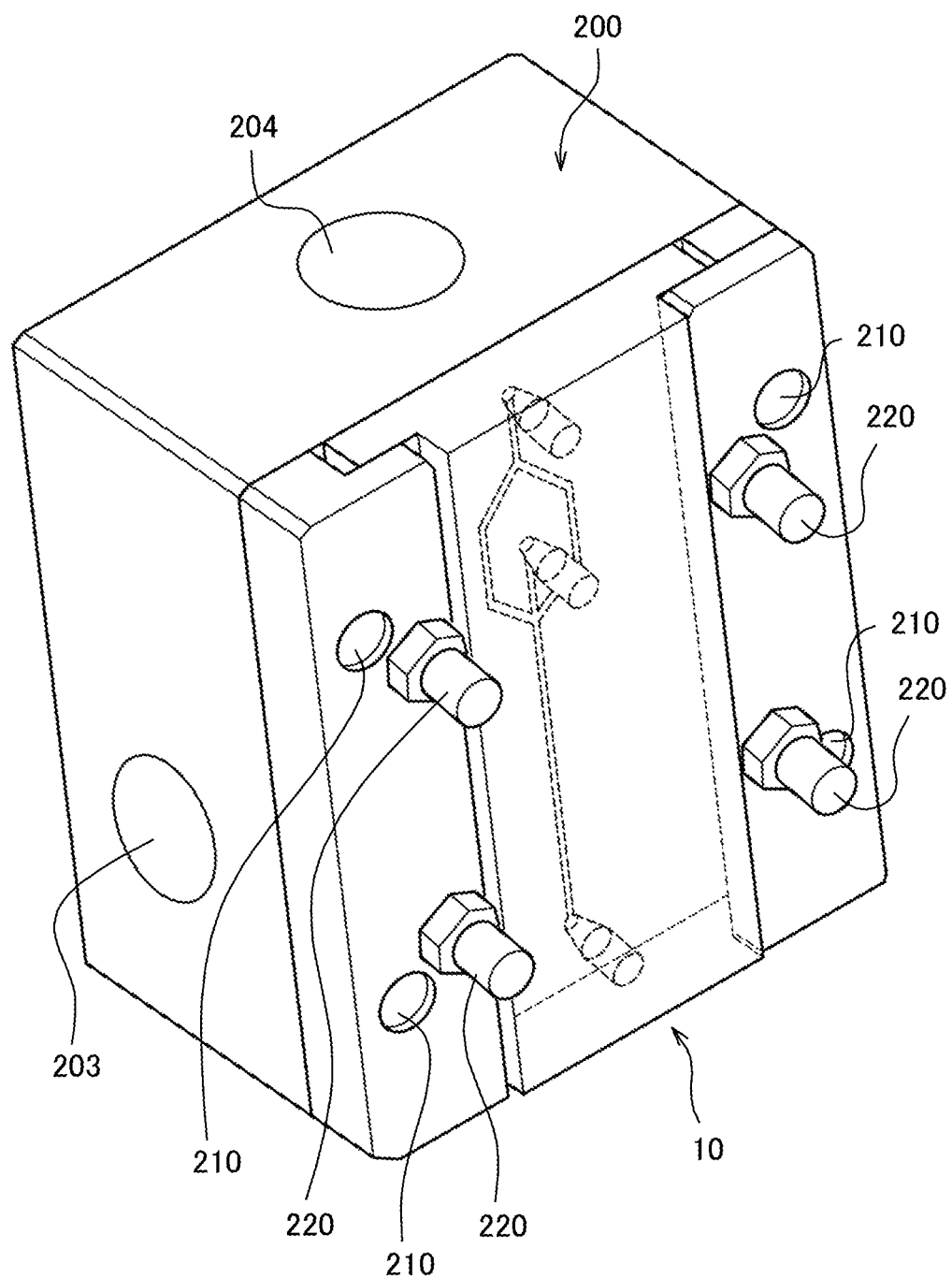
FIG. 14 is a view showing a modification of the microreactor.

FIG. 13 is a schematic diagram of the microreactor system according to the seventh embodiment. FIG. 14 is a diagram showing a modification of the microreactor.

As shown in FIG. 13, similarly to the microreactor system 6, the microreactor system 7 according to the seventh embodiment includes the plurality of microreactors (10A, 10B, 10C) connected in series, the fluid containers (11, 21, 31, 41), the fluid pumps (12, 22, 32, 42), the fluid detection sensors (13a, 13b, 13c, 23, 33, 43), the tube, the valves (14a, 14b, 14c, 24, 34, 44, 84a, 84b), the recovery container 18a, the disposal container 18b, the leak detection sensors (16a, 16b, 16c, 15, 25, 35, 45), the weight sensors (17, 27, 37, 47) for the fluid to be mixed, and the mixed fluid weight sensor 87.

The microreactor system 7 according to the seventh embodiment is different from the microreactor system 6 in that the microreactors (10A, 10B, 10C) are respectively provided with temperature control blocks (temperature controllers) (200a, 200b, 200c) that control the temperature of the microreactors, and fluid temperature control devices (temperature controllers) (19a, 19b, 19c) that control the temperature of the mixed fluid mixed in the microreactors (10A, 10B, 10C) are respectively provided downstream of the microreactors (10A, 10B, 10C).

In the microreactor system 7, as shown in FIG. 13, the first-stage microreactor 10A is provided with a first temperature control block 200a, the second-stage microreactor 10B is provided with a second temperature control block 200b, and the third-stage microreactor 10C is provided with a third temperature control block 200c.

Further, a temperature control device 19a for the primary mixed fluid is provided between the outlet of the first-stage microreactor 10A and the inlets of the second-stage microreactor 10B. A temperature control device 19b for the secondary mixed fluid is provided between the outlet of the second-stage microreactor 10B and the inlets of the third-stage microreactor 10C. A temperature control device 19c for the tertiary mixed fluid is provided downstream of the outlet of the third-stage microreactor 10C.

As denoted by reference sign 200 in FIG. 14, the first temperature control block 200a, the second temperature control block 200b, and the third temperature control block 200c are each provided adjacent to one face of each of the microreactors (10A, 10B, 10C) (as denoted by reference sign 10). The temperature control block 200 shown in FIG. 14 is aligned with the microreactor (10) by a positioning through hole 210, and is fixed in close contact with the microreactor (10) by a screw 220 with spring.

The temperature control block 200 has an introduction port 203 into which a heat medium is introduced, and a discharge port 204 from which the heat medium is discharged. The heat medium of which temperature has been adjusted by a temperature controller (not shown) is supplied to the temperature control block 200 through the introduction port 203. Then, the heat medium introduced from the introduction port 203 adjusts the temperature of the microreactor (10), and then is discharged from the discharge port 204.

The temperature control blocks (200a, 200b, 200c) are made of a material having a high thermal conductivity, such as stainless steel, Hastelloy, or copper. A channel through which the heat medium flows may be provided in any form with respect to the microchannel of the microreactor (10). For example, the channel may be provided in parallel with the microchannel, or may be provided in a shape crossing the microchannel in a cross-sectional view. Further, the channel through which a working medium flows may be a stacked type configured by stacking plate-shaped temperature control blocks.

As shown by two-dot chain lines in FIG. 13, the temperature control device 19a for the primary mixed fluid, the temperature control device 19b for the secondary mixed fluid, and the temperature control device 19c for the tertiary mixed fluid respectively control the temperature of the fluids flowing through the tube connected to the outlets of the microreactors (10A, 10B, 10C). The temperature control device 19a for the primary mixed fluid, the temperature control device 19b for the secondary mixed fluid, and the temperature control device 19c for the tertiary mixed fluid are configured by, for example, various detection-type tubular thermostats.

In the above microreactor system 7 and the operation method thereof, even when the fluids mixed in the microreactors (10A, 10B, 10C) cause an exothermic reaction or an endothermic reaction, reaction efficiency can be maintained high by appropriately controlling the temperature of the fluids with the temperature control blocks (200a, 200b, 200c) and the fluid temperature control devices (19a, 19b, 19c).

Although the embodiments and the modification of the present invention have been described above, the present invention is not limited to the above aspects, and various changes can be made without departing from the spirit of the present invention. For example, the present invention is not limited to one having all the configurations included in the embodiments and the modification. A part of the configuration of any of the embodiments or the modification can be replaced with the configuration of another embodiment or modification. A part of the configuration of any of the embodiments or modification can be added to another embodiment or modification. A part of the configuration of any of the embodiments or modification can be omitted.

For example, the microreactor system 1 may have a configuration in which the plurality of microreactors 10 are connected in series. In this configuration, the operating methods shown in FIGS. 3 and 4 may be applied to the microreactor 10 at any stage. In the microreactor systems 1, 2, 3, 4, 5, 6, and 7, the number of the stages of the microreactors connected in series may be any number of one or more, and any number of two or more types of fluids may be mixed.

Further, installation positions of the fluid pumps, the fluid detection sensors, the valves, the leak detection sensors, the weight sensors, the temperature control blocks, the temperature control devices for the fluid, and the like may be changed or installation thereof may be partially omitted as long as the functions thereof are not impaired. As the first fluid, the second fluid, and the other fluids, a liquid may be used, a gas may be used, a liquid containing a solid maybe used, or a liquid containing a gas may be used. Alternatively, a liquid and a gas may be used respectively. A material that can be handled as a fluid can be used.

The microreactor included in each of the microreactor systems 1, 2, 3, 4, 5, 6, and 7 may have an appropriate shape as long as the microreactor has a microchannel that mixes at least two fluids. For example, the microreactor can be provided in an appropriate shape such as a Y-shape or a T-shape in plan view, or in such a shape that the fluids forma multilayer flow and merge. The channel volume after the two fluids flow in the channel until the two fluids merge may or may not be even.

REFERENCE SIGNS LIST 1, 2, 3, 4, 5, 6, 7 microreactor system
10 microreactor
10A first-stage microreactor
10B second-stage microreactor
10C third-stage microreactor
11 fluid A container
12 fluid A pump (first-stage first fluid pump)
13a fluid A detection sensor (fluid detector for first-stage first fluid)
13b primary mixed fluid detection sensor (fluid detector for mixed fluid)
13c secondary mixed fluid detection sensor (fluid detector for mixed fluid)
14a fluid A valve
14b primary mixed fluid valve
14c secondary mixed fluid valve
15 fluid A leak detection sensor (leak detector)
16a first leak detection sensor (leak detector)
16b second leak detection sensor (leak detector)
16c third leak detection sensor (leak detector)
17 fluid A weight sensor (first weight detector)
18 recovery container
18a recovery container
18b disposal container
19a temperature control device for primary mixed fluid (temperature controller)
19b temperature control device for secondary mixed fluid (temperature controller)
19c temperature control device for tertiary mixed fluid (temperature controller)
21 fluid B container
22 fluid B pump (first-stage second fluid pump)
23 fluid B detection sensor (fluid detector for first-stage second fluid)
24 fluid B valve
25 fluid B leak detection sensor (leak detector)
27 fluid B weight sensor (first weight detector)
31 fluid C container
32 fluid C pump (pump for fluid to be mixed)

33 fluid C detection sensor (fluid detector for fluid to be mixed)
34 fluid C valve
35 fluid C leak detection sensor (leak detector)
37 fluid C weight sensor (first weight detector)
41 fluid D container
42 fluid D pump (pump for fluid to be mixed)
43 fluid D detection sensor (fluid detector for fluid to be mixed)
44 fluid D valve
45 fluid D leak detection sensor (leak detector)
47 fluid D weight sensor (first weight detector)
84a recovery valve
84b disposal valve
87 mixed fluid weight sensor (second weight detector)
100A upper plate
100B lower plate
101 high flow rate inlet
102 low flow rate inlet
104 outlet
110 high flow rate channel
110a, 110b Branch channel
120 low flow rate channel
130 junction
140 discharge channel
111 first fluid container
112 first fluid pump (first pump)
113 first fluid detection sensor (first fluid detector)
118 recovery container
121 second fluid container
122 second fluid pump (second pump)
123 second fluid detection sensor (second fluid detector)
200a first temperature control block (temperature controller)
200b second temperature control block (temperature controller)
200c third temperature control block (temperature controller)
203 introduction port
204 discharge port
t tube
t10 recovery pipe (recovery path)
t20 disposal pipe (disposal path)

The invention claimed is:

1. A microreactor system comprising:
a first-stage microreactor that has two inlets into which fluids are introduced and a channel merging the fluids, and mixes, in the channel, a first-stage first fluid introduced from a first inlet of the inlets and a first-stage second fluid introduced from a second inlet of the inlets;
a plurality of microreactors in subsequent stages that are disposed in series downstream of the first-stage microreactor, the microreactors in subsequent stages each having two inlets into which a fluid is introduced and a channel that merges the fluid, and mixes, in the channel, a mixed fluid introduced from the first inlet and a fluid to be mixed introduced from the second inlet, the mixed fluid being generated in a microreactor in a preceding stage;
a first-stage first fluid pump that sends the first-stage first fluid toward the first inlet of the first-stage microreactor;
a first-stage second fluid pump that sends the first-stage second fluid toward the second inlet of the first-stage microreactor;
a plurality of pumps for the fluid to be mixed that are disposed in each of the microreactors in the subsequent stages and send the fluid to be mixed toward each of the second inlets of the microreactors in the subsequent stages;
a fluid detector for the first-stage first fluid that detects an arrival of the first-stage first fluid at the first inlet of the first-stage microreactor;
a fluid detector for the first-stage second fluid that detects an arrival of the first-stage second fluid at the second inlet of the first-stage microreactor;
a plurality of fluid detectors for a mixed fluid that are disposed in each of the microreactors in the subsequent stages and detect an arrival of the mixed fluid generated in the preceding microreactor at each of the first inlets of the microreactors in the subsequent stages; and
a plurality of fluid detectors for the fluid to be mixed that are disposed in each of the microreactors in the subsequent stages and detect an arrival of the fluid to be mixed at each of the second inlets of the microreactors in the subsequent stages,
wherein the first-stage first fluid pump, after starting a transfer of the first-stage first fluid toward the first inlet of the first-stage microreactor, stops the transfer by detection by the fluid detector for the first-stage first fluid,
the first-stage second fluid pump, after starting a transfer of the first-stage second fluid toward the second inlet of the first-stage microreactor, stops the transfer by detection by the fluid detector for the first-stage second fluid,
each of the pumps for the fluid to be mixed, after starting a transfer of the fluid to be mixed toward each of the second inlets of the microreactors in the subsequent stages, stops the transfer by detection by the fluid detector for the fluid to be mixed,
each of the first-stage first fluid pump and the first-stage second fluid pump resumes the transfer after the detection by the fluid detector for the first-stage first fluid and after the detection by the fluid detector for the first-stage second fluid,
the first-stage first fluid of which transfer has been temporarily stopped and the first-stage second fluid of which transfer has been temporarily stopped are introduced into the first-stage microreactor and mixed,
the pump for the fluid to be mixed resumes the transfer after the transfer of the fluid to be mixed is stopped and after the detection by the fluid detector for the mixed fluid,
the mixed fluid generated in the microreactor in the preceding stage and the fluid to be mixed of which transfer has been temporarily stopped are introduced into the microreactors in the subsequent stages and mixed, and
the mixed fluid and the fluid to be mixed are sequentially mixed in the microreactors in the subsequent stages.

2. The microreactor system according to claim 1, comprising a valve capable of opening and closing a channel at each of the inlets of the microreactor.

3. The microreactor system according to claim 1, wherein a recovery path that recovers the mixed fluid and a disposal path that discards the fluid are branched and connected downstream of the microreactor.

4. The microreactor system according to claim 1, wherein each of the microreactors includes a leak detector that detects a fluid leak.

5. The microreactor system according to claim 1, wherein each of the pumps includes a leak detector that detects a fluid leak.

6. The microreactor system according to claim 1, comprising:
a first weight detector that detects a change in weight of each of the fluids introduced into the microreactor, and
a second weight detector that detects a change in weight of the fluid recovered from the microreactor.

7. The microreactor system according to claim 1, wherein the microreactor includes a temperature controller that controls a temperature of the microreactor.

8. The microreactor system according to claim 1, comprising a fluid temperature controller that controls a temperature of the fluid mixed in the microreactor, downstream of the microreactor.

* * * * *